(12) United States Patent
Koehler

(10) Patent No.: US 7,529,534 B2
(45) Date of Patent: May 5, 2009

(54) SIGNAL CONVERTER FOR CONVERTING A START SIGNAL TO AN END SIGNAL AND METHOD FOR CONVERTING A START SIGNAL TO AN END SIGNAL

(75) Inventor: Stefan Koehler, Roedental (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 514 days.

(21) Appl. No.: 11/300,191

(22) Filed: Dec. 13, 2005

(65) Prior Publication Data

US 2006/0178759 A1 Aug. 10, 2006

(30) Foreign Application Priority Data

Dec. 13, 2004 (DE) .................. 10 2004 059 940

(51) Int. Cl.
*H04B 1/16* (2006.01)
(52) U.S. Cl. .................. 455/334; 455/304; 375/332
(58) Field of Classification Search ............. 455/323, 455/189.1, 325, 334, 304; 375/332, 322
See application file for complete search history.

(56) References Cited

U.S. PATENT DOCUMENTS

| | | | |
|---|---|---|---|
| 4,803,703 | A | 2/1989 | DeLuca |
| 6,009,334 | A | 12/1999 | Grubeck et al. |
| 6,424,683 | B1 | 7/2002 | Schollhorn |
| 6,970,687 | B1 * | 11/2005 | Kluge et al. ............... 455/323 |
| 2003/0053558 | A1 | 3/2003 | Unger et al. |

(Continued)

FOREIGN PATENT DOCUMENTS

DE 19802373 C1 1/1998

(Continued)

OTHER PUBLICATIONS

Frerking, M. Digital Signal Processing in Communication Systems. Frequency Translation.

(Continued)

*Primary Examiner*—Edward Urban
*Assistant Examiner*—Christian A Hannon
(74) *Attorney, Agent, or Firm*—Michael A. Glenn; Glenn Patent Group

(57) ABSTRACT

A signal converter for converting a start signal into an end signal includes means for copying the start signal to obtain a plurality of copied start signals, wherein a copied start signal may be fed into a processing branch as a branch signal. Further, the signal converter includes a first branch processing means in a first processing branch for processing a first branch signal according to a first processing regulation to obtain a first processed branch signal. Further, the signal converter includes a second branch processing means in a second processing branch for processing a second branch signal according to a second processing regulation to obtain a second processed branch signal, wherein the second processing regulation is different from the first processing regulation and wherein the first processing regulation and the second processing regulation are implemented to cause a low-pass polyphase filtering of the copied start signals. Finally, the signal converter includes selection means for sequentially selecting the first processed branch signal and then the second processed branch signal in order to obtain the end signal.

16 Claims, 29 Drawing Sheets

U.S. PATENT DOCUMENTS

| | | |
|---|---|---|
| 2003/0128161 A1 | 7/2003 | Oh et al. |
| 2003/0215035 A1 | 11/2003 | Amerga et al. |
| 2003/0227895 A1 | 12/2003 | Strutt et al. |
| 2004/0072579 A1 | 4/2004 | Hottinen |
| 2004/0203871 A1 | 10/2004 | Geier et al. |

FOREIGN PATENT DOCUMENTS

| | | |
|---|---|---|
| EP | 0 632 577 | 1/1995 |
| EP | 0 930 704 A2 | 11/1998 |
| EP | 0 933 882 | 8/1999 |
| EP | 1 089 452 | 4/2001 |
| EP | 1089452 A1 | 4/2001 |
| EP | 1206068 A2 | 5/2002 |
| WO | WO 03/001699 | 1/2003 |
| WO | WO 2005/098465 A2 | 10/2005 |

OTHER PUBLICATIONS

Li, Xinrong, et al.; Super-Resolution TOA Estimation With Diversity for Indoor Geolocation; Jan. 1, 2004; IEEE.

Samueli, H. et al.; A VLSI Architecture for a High-Speed All Digital Quadrature Modulator and Demodulator for Digital Radio Applications; Oct. 8, 1990; IEEE.

Tanai, H. et al.; A Modem Implementation Using a Periodically Time Varying Digital Filter; Nov. 1991; IEEE.

Harris, F. Multirate Signal Processing for Communication systems: 2004. Prentice Hall. ISBE 0-13-146511-2, p. 403-407.

Fliege, N. Multiraten-Signalverarbeitung. 1993. Stuttgart, Teubner Verlag. ISBN 3-519-06155-4. p. 256-258.

Harris, F. Multirate Signal Processing for Communication Systems. May 14, 2004. Prentice Hall. p. 400-407.

Fliege, N. Multiraten-signalverarbeitung. 1993. Germany. p. 256-258.

\* cited by examiner

|  | POSITIVE FREQUENCY SHIFT | | NEGATIVE FREQUENCY SHIFT | |
|---|---|---|---|---|
| TIME INDEX n | $\cos(n\pi/2)$ | $\sin(n\pi/2)$ | $\cos(-n\pi/2)$ | $\sin(-n\pi/2)$ |
| 0 | 1 | 0 | 1 | 0 |
| 1 | 0 | 1 | 0 | -1 |
| 2 | -1 | 0 | -1 | 0 |
| 3 | 0 | -1 | 0 | 1 |

FIGURE 3

| TIME INDEX n | POSITIVE FREQUENCY SHIFT | | NEGATIVE FREQUENCY SHIFT | |
| --- | --- | --- | --- | --- |
| | Re{y[n]} | Im{y[n]} | Re{y[n]} | Im{y[n]} |
| 0 | i[0] | q[0] | i[0] | q[0] |
| 1 | -q[1] | i[1] | q[1] | -i[1] |
| 2 | -i[2] | -q[2] | -i[2] | -q[2] |
| 3 | q[3] | -i[3] | -q[3] | i[3] |
| 4 | i[4] | q[4] | i[4] | q[4] |
| 5 | -q[5] | i[5] | q[5] | -i[5] |
| 6 | -i[6] | -q[6] | -i[6] | -q[6] |
| 7 | q[7] | -i[7] | -q[7] | i[7] |
| 8 | i[8] | q[8] | i[8] | q[8] |
| 9 | -q[9] | i[9] | q[9] | -i[9] |
| 10 | -i[10] | -q[10] | -i[10] | -q[10] |
| 11 | q[11] | -i[11] | -q[11] | i[11] |
| 12 | i[12] | q[12] | i[12] | q[12] |
| 13 | -q[13] | i[13] | q[13] | -i[13] |

FIGURE 4

| Value | Coefficient |
|---|---|
| -0,00161106077678 | $=a_0$ |
| -0,00234731818860 | $=a_1$ |
| -0,00173182413480 | $=a_2$ |
| 0,00000000000004 | $=a_3$ |
| 0,00720377784510 | $=a_4$ |
| 0,01062413762642 | $=a_5$ |
| 0,00794256839925 | $=a_6$ |
| -0,00000000000012 | $=a_7$ |
| -0,02082456810098 | $=a_8$ |
| -0,03123125277165 | $=a_9$ |
| -0,02379167980953 | $=a_{10}$ |
| 0,00000000000023 | $=a_{11}$ |
| 0,04899080088419 | $=a_{12}$ |
| 0,07554931686914 | $=a_{13}$ |
| 0,05947272350759 | $=a_{14}$ |
| -0,00000000000036 | $=a_{15}$ |
| -0,10789013643074 | $=a_{16}$ |
| -0,17670997703090 | $=a_{17}$ |
| -0,15044737627148 | $=a_{18}$ |
| 0,00000000000047 | $=a_{19}$ |
| 0,29590602436736 | $=a_{20}$ |
| 0,62395779269402 | $=a_{21}$ |
| 0,88655696509758 | $=a_{22}$ |
| 0,99999999999949 | $=a_{23}$ |
| 0,88655696509758 | $=a_{24}$ |
| 0,62395779269402 | $=a_{25}$ |
| 0,29590602436736 | $=a_{26}$ |
| 0,00000000000047 | $=a_{27}$ |
| -0,15044737627148 | $=a_{28}$ |
| -0,17670997703090 | $=a_{29}$ |
| -0,10789013643074 | $=a_{30}$ |
| -0,00000000000036 | $=a_{31}$ |
| 0,05947272350759 | $=a_{32}$ |
| 0,07554931686914 | $=a_{33}$ |
| 0,04899080088419 | $=a_{34}$ |
| 0,00000000000023 | $=a_{35}$ |
| -0,02379167980953 | $=a_{36}$ |
| -0,03123125277165 | $=a_{37}$ |
| -0,02082456810098 | $=a_{38}$ |
| -0,00000000000012 | $=a_{39}$ |
| 0,00794256839925 | $=a_{40}$ |
| 0,01062413762642 | $=a_{41}$ |
| 0,00720377784510 | $=a_{42}$ |
| 0,00000000000004 | $=a_{43}$ |
| -0,00173182413480 | $=a_{44}$ |
| -0,00234731818860 | $=a_{45}$ |
| -0,00161106077678 | $=a_{46}$ |

FIGURE 9

| SIGNALS | WORD WIDTH | DATA RATE | DATA TYPE |
|---|---|---|---|
| Net27 | tbd | B_clock | komplex |
| Net1 | tbd | B_clock | komplex |
| Net17 | tbd | B_clock | komplex |
| Net16 | tbd | B_clock | komplex |
| Net12 | tbd | B_clock_4 | komplex |
| Net13 | tbd | B_clock_4 | komplex |
| Net15 | tbd | B_clock_4 | komplex |
| Net18 | tbd | B_clock_4 | komplex |
| Net19 | tbd | B_clock_4 | komplex |
| Net20 | tbd | B_clock_4 | komplex |
| Net21 | tbd | B_clock_4 | komplex |
| Net22 | tbd | B_clock_4 | komplex |
| Net23 | tbd | B_clock_4 | komplex |
| Net24 | tbd | B_clock_4 | komplex |
| Net25 | tbd | B_clock_4 | komplex |
| Net26 | tbd | B_clock_4 | komplex |
| Net28 | tbd | B_clock_16 | komplex |
| Net29 | tbd | B_clock_16 | komplex |
| Net30 | tbd | B_clock_16 | komplex |
| Net31 | tbd | B_clock_16 | komplex |
| Net32 | tbd | B_clock_16 | komplex |
| Net33 | tbd | B_clock_16 | komplex |
| Net34 | tbd | B_clock_16 | komplex |
| Net35 | tbd | B_clock_16 | komplex |
| Net36 | tbd | B_clock_16 | komplex |

FIGURE 12

| INPUT SIGNAL | OUTPUT SIGNAL | PARAMETER fs_shift_1 |
|---|---|---|
| Net12 | Net18 | -1 |
| Net12 | Net19 | 0 |
| Net12 | Net20 | 1 |
| Net13 | Net21 | -1 |
| Net13 | Net22 | 0 |
| Net13 | Net23 | 1 |
| Net15 | Net24 | -1 |
| Net15 | Net25 | 0 |
| Net15 | Net26 | 1 |

FIGURE 13

| SIGNALS | WORD WIDTH | DATA RATE | DATA TYPE |
|---|---|---|---|
| Net6 | tbd | B_clock / B_clock_4 | komplex |
| Net8 | tbd | B_clock_4 / B_clock_16 | komplex |
| Net9 | tbd | B_clock_4 / B_clock_16 | komplex |
| Net10 | tbd | B_clock_4 / B_clock_16 | komplex |
| Net11 | tbd | B_clock_4 / B_clock_16 | komplex |
| Net12 | tbd | B_clock_4 / B_clock_16 | komplex |
| Net14 | tbd | B_clock_4 / B_clock_16 | komplex |
| Net15 | tbd | B_clock_4 / B_clock_16 | komplex |
| Net13 | tbd | B_clock_4 / B_clock_16 | komplex |
| Net7 | tbd | B_clock_4 / B_clock_16 | komplex |

FIGURE 15

| TIME INDEX n | $a_0$ | $a_1$ | $a_2$ | $a_3$ | $a_4$ | $a_5$ |
|---|---|---|---|---|---|---|
| 0 | $x_0$ | 0 | 0 | 0 | 0 | 0 |
| 1 | $x_1$ | $x_0$ | 0 | 0 | 0 | 0 |
| 2 | $x_2$ | $x_1$ | $x_0$ | 0 | 0 | 0 |
| 3 | $x_3$ | $x_2$ | $x_1$ | $x_0$ | 0 | 0 |
| 4 | $x_4$ | $x_3$ | $x_2$ | $x_1$ | $x_0$ | 0 |
| 5 | $x_5$ | $x_4$ | $x_3$ | $x_2$ | $x_1$ | $x_0$ |
| 6 | $x_6$ | $x_5$ | $x_4$ | $x_3$ | $x_2$ | $x_1$ |
| 7 | $x_7$ | $x_6$ | $x_5$ | $x_4$ | $x_3$ | $x_2$ |
| 8 | $x_8$ | $x_7$ | $x_6$ | $x_5$ | $x_4$ | $x_3$ |
| 9 | $x_9$ | $x_8$ | $x_7$ | $x_6$ | $x_5$ | $x_4$ |

FIGURE 16

| TIME INDEX n (OF THE NEW SAMPLING RATE) | ... | 3 | 2 | 1 | 0 | | POLYPHASE FILTER | |
|---|---|---|---|---|---|---|---|---|
| POLYPHASE 1 | . | $x_{12}$ | $x_8$ | $x_4$ | 0 | => | $a_0$ | $a_4$ |
| POLYPHASE 2 | . | $x_{11}$ | $x_7$ | $x_3$ | $x_0$ | | $a_1$ | $a_5$ |
| POLYPHASE 3 | . | $x_{10}$ | $x_6$ | $x_2$ | 0 | | $a_2$ | 0 |
| POLYPHASE 4 | . | $x_{09}$ | $x_5$ | $x_1$ | 0 | | $a_3$ | 0 |

FIGURE 17

| TIME INDEX n (OF THE NEW SAMPLING RATE) | . . . | 3 | 2 | 1 | 0 | | POLYPHASE FILTER |
|---|---|---|---|---|---|---|---|
| POLYPHASE 1 (re) | . | $i_{12}$ | $i_8$ | $i_4$ | 0 | $=>$ | $a_0$ $a_4$ |
| POLYPHASE 2 (re) | . | $q_{11}$ | $q_7$ | $q_3$ | $i_0$ | | $a_1$ $a_5$ |
| POLYPHASE 3 (re) | . | $-i_{10}$ | $-i_6$ | $-i_2$ | 0 | | $a_2$ 0 |
| POLYPHASE 4 (re) | . | $-q_{09}$ | $-q_5$ | $-q_1$ | 0 | | $a_3$ 0 |
| | | | | | | | $\Sigma$ |

FIGURE 19

| TIME INDEX n (OF THE NEW SAMPLING RATE) | . | 3 | 2 | 1 | 0 | | POLYPHASE FILTER | |
|---|---|---|---|---|---|---|---|---|
| POLYPHASE 1 (im) | . | $q_{12}$ | $q_8$ | $q_4$ | $q_0$ | $\Rightarrow$ | $a_0$ | $a_4$ |
| POLYPHASE 2 (im) | . | $-i_{11}$ | $-i_7$ | $-i_3$ | 0 | | $a_1$ | $a_5$ |
| POLYPHASE 3 (im) | . | $-q_{10}$ | $-q_6$ | $-q_2$ | 0 | | $a_2$ | 0 |
| POLYPHASE 4 (im) | . | $i_{09}$ | $i_5$ | $i_1$ | 0 | | $a_3$ | 0 |
| | | | | | | | $\Sigma$ | |

FIGURE 20

| TIME INDEX n (OF THE NEW SAMPLING RATE) | . . . . . . . | 3 | 2 | 1 | 0 | | POLYPHASE FILTER | | |
|---|---|---|---|---|---|---|---|---|---|
| POLYPHASE 1 (re) |  | $i_{12}$ | $i_8$ | $i_4$ | 0 | | $a_0$ | $a_4$ | |
| POLYPHASE 2 (im) |  | $-i_{11}$ | $-i_7$ | $-i_3$ | $i_0$ | $\Rightarrow$ | $a_1$ | $a_5$ | |
| POLYPHASE 3 (re) |  | $-i_{10}$ | $-i_6$ | $-i_2$ | 0 | | $a_2$ | 0 | |
| POLYPHASE 4 (im) |  | $i_9$ | $i_5$ | $i_1$ | 0 | | $a_3$ | 0 | |
| POLYPHASE 1 (im) |  | $q_{12}$ | $q_8$ | $q_4$ | $q_0$ | | $a_0$ | $a_4$ | |
| POLYPHASE 2 (re) |  | $q_{11}$ | $q_7$ | $q_3$ | 0 | | $a_1$ | $a_5$ | |
| POLYPHASE 3 (im) |  | $-q_{10}$ | $-q_6$ | $-q_2$ | 0 | | $a_2$ | 0 | |
| POLYPHASE 4 (re) |  | $-q_9$ | $-q_5$ | $-q_1$ | 0 | | $a_3$ | 0 | |
|  |  |  |  |  |  | | REAL PART | $\Sigma$ | |
|  |  |  |  |  |  | | IMAGINARY PART | $\Sigma$ | |

FIGURE 21

| TIME INDEX n (OF THE NEW SAMPLING RATE) | 3 | 2 | 1 | 0 |   | POLYPHASE FILTER | RESULT OF THE FILTERS |
|---|---|---|---|---|---|---|---|
| POLYPHASE 1 (re) | $i_{12}$ | $i_8$ | $i_4$ | $i_0$ |  | POLY FIR 1 | RE P OUT 1 |
| POLYPHASE 2 (im) | $i_{11}$ | $i_7$ | $i_3$ | 0 |  | POLY FIR 2 | RE P OUT 2 |
| POLYPHASE 3 (re) | $i_{10}$ | $i_6$ | $i_2$ | 0 | > | POLY FIR 3 | RE P OUT 3 |
| POLYPHASE 4 (im) | $i_9$ | $i_5$ | $i_1$ | 0 |  | POLY FIR 4 | RE P OUT 4 |
| POLYPHASE 1 (im) | $q_{12}$ | $q_8$ | $q_4$ | $q_0$ |  | POLY FIR 1 | IM P OUT 1 |
| POLYPHASE 2 (re) | $q_{11}$ | $q_7$ | $q_3$ | 0 |  | POLY FIR 2 | IM P OUT 2 |
| POLYPHASE 3 (im) | $q_{10}$ | $q_6$ | $q_2$ | 0 |  | POLY FIR 3 | IM P OUT 3 |
| POLYPHASE 4 (re) | $q_9$ | $q_5$ | $q_1$ | 0 |  | POLY FIR 4 | IM P OUT 4 |

FIGURE 22

NO FREQUENCY SHIFT

REAL PART = Σ(RE_P_OUT_1, RE_P_OUT_2, RE_P_OUT_3, RE_P_OUT_4)

IMAGINARY PART = Σ(IM_P_OUT_1, IM_P_OUT_2, IM_P_OUT_3, IM_P_OUT_4)

FREQUENCY SHIFT IN THE POSITIVE DIRECTION

REAL PART = Σ(RE_P_OUT_1, IM_P_OUT_2, -RE_P_OUT_3, -IM_P_OUT_4)

IMAGINARY PART = Σ(IM_P_OUT_1, -RE_P_OUT_2, -IM_P_OUT_3, RE_P_OUT_4)

FREQUENCY SHIFT IN THE NEGATIVE DIRECTION

REAL PART = Σ(RE_P_OUT_1, -IM_P_OUT_2, -RE_P_OUT_3, IM_P_OUT_4)

IMAGINARY PART = Σ(IM_P_OUT_1, RE_P_OUT_2, -IM_P_OUT_3, -RE_P_OUT_4)

FIGURE 23

SIGNAL CONVERTER FOR CONVERTING A START SIGNAL TO AN END SIGNAL AND METHOD FOR CONVERTING A START SIGNAL TO AN END SIGNAL

BACKGROUND OF THE INVENTION

1. Field of the Invention

The present invention relates to a signal converter and a method for converting a start signal to an end signal, and in particular the present invention relates to a signal converter and a method for converting a start signal to an end signal which may be employed using digital signal-processing components in telecommunications or high-frequency technology.

2. Description of the Related Art

In telecommunications, to shift a signal from a current frequency (current frequency) into a higher transmission frequency (target frequency) mainly mixers are used. For such a shifting, for example in the transmitter several different possibilities are possible. First, a signal having a low bandwidth $B_{low}$ may be shifted to different center frequencies within a large bandwidth B. If this center frequency is constant over a longer period of time, then this means nothing but the selection of a subband within the larger frequency band. Such a proceeding is referred to as "tuning". If the center frequency to which the signal is to be shifted varies relatively fast, such a system is referred to as a frequency-hopping system or a spread-spectrum system. As an alternative, also within a large bandwidth B several transmission signals may be emitted in parallel in the frequency multiplexer with a respectively low bandwidth $B_{low}$.

Analog to these proceedings in the transmitter, the respective receivers are to be implemented accordingly. This means on the one hand that a subband of the large bandwidth B is to be selected when the center frequency of the transmitted signal is constant over a longer period of time. The tuning is then performed to the predetermined center frequency. If the center frequency is varied relatively fast, as it is the case with a frequency-hopping system, also in the receiver a fast temporal change of the center frequency of the transmitted signal has to take place. If several transmit signals have been sent out in parallel in the frequency multiplexer, also a parallel reception of those several frequency-multiplexed signals within the larger bandwidth B has to take place.

Conventionally, for an above-indicated tuning system and a frequency-hopping system an analog or digital mixer is used, wherein the digital mixing conventionally takes place with one single mixer stage. In an analog mixer, a high expense in circuit technology is necessary, as for a precise mixing to the target frequency highly accurate mixer members are required which substantially increase the costs of the transmitter to be manufactured. It is to be noted with regard to a digital mixer that in certain respects a high expense in terms of circuit engineering (or numerics, respectively) is required when the signal is to be mixed onto a freely selectable random target frequency.

For a parallel transmitting and receiving of several frequency sub-bands, further frequently the OFDM method (orthogonal frequency division multiplexing) and related multicarrier or multitone modulation methods, respectively are used. The same require, by the use of the Fourier transformation, a partially substantial computational overhead, in particular if only a few of the frequency sub-bands from a large frequency band having several individual frequency sub-bands are required.

Conventional mixers may here be implemented in a similar way to the mixer device 2400, as it is illustrated in FIG. 24A, wherein this mixer device 2400 is related to a downconversion. Without limitation of generality, however, also a corresponding arrangement of the components of the mixer device illustrated in FIG. 24A may be used for an upconversion, however. Such a mixer device is illustrated in FIG. 24B.

The mixer device 2400 in FIG. 24A may comprise a mixer 2402, a low-pass filter 2404 and a downsampler 2406. The mixer 2402 includes an input 2408 for receiving a signal 2410 to be mixed. Further, the mixer 2402 includes an output 2412 for outputting the signal 2414 converted from the current frequency to a target frequency, which is supplied via an input 2416 of the low-pass filter 2404 to the same. Further, the low-pass filter 2404 includes an output 2418 for outputting a frequency-converted low-pass filtered signal 2420 which may be supplied via an input 2422 of the downsampler 2406 to the same. The downsampler 2406 includes an output 2424 for outputting a downsampled signal 2426, which is simultaneously an output signal output by the mixer device 2400. In FIG. 24B, components are illustrated corresponding to the mixer 2402, the low-pass filter 2404 and the downsampler 2406, wherein in the interconnection according to FIG. 24B an upconverter 2400a is realized. With regard to this, the order of the components was changed such that first an upsampler 2406a corresponding to the downsampler 2406 for an upconversion is connected upstream to the low-pass filter 2404 and downstream from the mixer 2402. The functionality of the mixer 2400a illustrated in FIG. 24B may be explained analog to the subsequent functionality of the mixer 2400 which is described in more detail, wherein the mixer 2400a shown in FIG. 24B is implemented to cancel an effect of the mixer 2400 of FIG. 24A on a signal.

If the input signal 2410 with the current frequency is supplied to the mixer device 2400 in FIG. 24A, wherein the start signal 2410 is based on a first sampling frequency defining an interval of two time-discrete signal values, then the mixer 2402 performs a conversion of the current frequency to an intermediate frequency, from which the intermediate frequency signal 2414 results. In this intermediate frequency signal 2414, only the frequency on which the start signal 2410 is located (i.e. the current frequency) is converted to an intermediate frequency, wherein the sampling frequency is not changed by the mixer 2402. With a suitable selection of the current frequency and the sampling frequency, in a simple way in terms of numerics or circuit engineering a mixing to the intermediate frequency signal 2414 having the intermediate frequency may be realized. If, for example, the spectral interval between the current frequency and the intermediate frequency is one quarter of the sampling frequency in its magnitude, then a mixing may be performed by a multiplication with the values 1, i, −1 and −i or by a negation of real part or imaginary part value, respectively, of the start signal 2410 and by an exchange of real and imaginary part values of start signal values of the start signal 2410. Such an approach which may be easily implemented with regard to numerics or hardware technology, is, for example, disclosed in Marvin E. Frerking, Digital Signal Processing in Communication Systems, Kluwer Academic Publishers.

Hereupon, a low-pass filtering of the intermediate frequency signal 2414 with the first sampling frequency takes place by the low-pass filter 2404, whereupon a low-pass filtered intermediate frequency signal 2402 results which is again based on the first sampling frequency. By the downsampler 2406 then a downsampling of the low-pass filtered intermediate frequency signal 2402 takes place, whereupon a reduction of the sampling frequency results without again spectrally converting the signal.

Such an approach of a mixer 2402 which may easily be realized in terms of numerics or circuit engineering has the disadvantage that by the predetermined connection between the current frequency and the sampling frequency only intermediate frequencies may be obtained which are arranged in a spectral interval of a quarter of the sampling frequency around the current frequency. This reduces the applicability of such a mixer 2402 which may efficiently be realized in terms of numerics or circuit engineering. If also intermediate frequencies are to be obtained, which comprise another interval to the current frequency than a quarter of the sampling frequency, a multiplication of the individual start signal values of the start signal 2410 with the rotating complex pointer $e^{j2\pi k f_c/f_s}$ is necessary, wherein k is a running index of the start signal values, $f_c$ is the desired center frequency (i.e. the intermediate frequency) and $f_s$ is the sampling frequency of the signal. It is to be considered, however, that in the multiplication of the start signal values with the rotating complex pointer not only purely real or purely imaginary multiplication factors, respectively, are to be used, but that the multiplication factors used comprise real and imaginary parts. By this, a solution efficient in terms of numerics and circuit engineering as it was indicated above may not be used. A mixer would be desired, however, which offers the possibility to perform a mixing of start signal values from a current frequency to any intermediate frequency in an efficient way in terms of numerics and circuit engineering.

Further, also a concept similar to downsampling may be realized for a spectral mixing using upsampling. A frequency converter or signal converter based on this concept is, for example, illustrated in FIG. 25 by the illustrated signal converter 2500. The signal converter 2500 illustrated in FIG. 25 further comprises the possibility to upsample and subsequently spectrally convert different start signals. Hereupon, a merging of the upsampled and spectrally converted start signals to a common end signal takes place.

In order to provide such a functionality, the signal converter 2500 comprises a first input 2502 for receiving a first start signal xplus[k], a second start signal input 2504 for receiving a second start signal xzero[k] and a third start signal input 2506 for receiving a third start signal xminus[k]. Further, the signal converter 2500 comprises a plurality of zero inputs 2508 for providing the signal converter with the value 0. In addition, the signal converter 2500 comprises a first multiplexer 2510, a second multiplexer 2512, a third multiplexer 2514, a fourth multiplexer 2516, a fifth multiplexer 2518 and a sixth multiplexer 2520. Additionally, the signal converter 2500 comprises a first demultiplexer 2522, a second demultiplexer 2524 and a third demultiplexer 2526. Further, the signal converter 2500 includes a first low-pass filter LP1, a second low-pass filter LP2 and a third low-pass filter LP3. Finally, the signal converter 2500 includes an adder 2528 for adding an output signal of the fourth multiplexer 2516, an output signal of the fifth multiplexer 2518 and an output signal 2534 of the sixth multiplexer 2520 to provide an end signal y[m]. Apart from that, the signal converter 2500 comprises a first processing means 2536, a second processing means 2538 and a third processing means 2540. Each of processing means 2536, 2538 and 2540 comprises four partial processing means 2542 which are implemented to perform a complex multiplication of an input signal with a complex multiplication factor.

The signal converter 2500 is interconnected such that by the first multiplexer to an input of the first low-pass filter LP1 a sequence consisting of a sampling value of the first start signal xplus[k] and a sequence of three consecutive zero values is supplied. An output of the first low-pass filter LP1 is connected to the first demultiplexer 2522. The first demultiplexer 2522 is implemented to allocate the low-pass filtered signal received from the first low-pass filter LP1 in temporal order first to a first partial processing means of the first processing means 2536, then to a second partial processing means and subsequently to a third partial processing means and finally to a fourth partial processing means. The first partial processing means here is implemented to perform a multiplication of a signal value with the factor 1, which may be realized in circuit engineering in particular by the fact that a signal is left unchanged in the first partial processing means. The second partial processing means is implemented to multiply a signal with the complex value j, while the third partial processing means is implemented to perform a negation of a signal. Further, the fourth partial processing means is implemented to perform a complex multiplication of a signal value with the factor −j. Further, the fourth multiplexer 2516 is connected to the first processing means 2536 such that in a temporally subsequent order first a signal processed by the first partial processing means, then a signal processed by the second partial processing means and then a signal processed by the third partial processing means and finally a signal processed by the fourth partial processing means is multiplexed to the output signal 2530 of the fourth multiplexer 2516. Analog to the above-described interconnection of the first multiplexer 2510 with the first low-pass filter LP1, the first demultiplexer 2522, the first processing means 2536 and the fourth multiplexer 2516 in the first processing branch also the second multiplexer 2512, the second low-pass filter LP2, the second demultiplexer 2524, the second processing means 2538 and the fifth multiplexer 2518 may be interconnected. In contrast to the interconnection in the first processing branch 2544, in the second processing branch 2546, however, the second start signal xzero[k] is multiplexed to the second low-pass filter LP2, while each of the partial processing means of the second processing means 2538 are implemented to perform a multiplication with the factor 1. In other words, this means that in the partial processing means of the second processing means 2538 no change of the signal needs to be performed. The second processing means 2538 may thus also be regarded as redundant and is only indicated in FIG. 25 for reasons of clarity of illustration to enable a better understanding of a signal processing in the first processing branch 2544 and in the third processing branch 2548.

Analog to the interconnection of the components in the first processing branch 2544, also an interconnection of the components in the third processing branch 2548 may be described. Here, by the third multiplexer 2514 either a value of the third start signal xminus[k] or one of three consecutive zero values is supplied to the third low-pass filter LP3. Hereupon, a signal output by the third low-pass filter LP3 is laid onto a first, second, third or fourth partial processing means of the third processing means 2540 by the third demultiplexer 2526. Here, the first partial processing means is implemented to perform a multiplication with the value 1, the second partial processing means is implemented to perform a multiplication with the value −j, the third partial processing means is implemented to perform a negation of the signal value and the fourth partial processing means is implemented to multiply a signal value with the value j. Further, an output value of the first, second, third or fourth partial processing means is sequentially multiplexed to the output 2536 of the sixth multiplexer 2520 by the sixth multiplexer 2520.

The mode of operation of such a signal converter 2500 may be described as follows. First, the first start signal xplus[k] is applied to the first input 2502 and multiplexed by the first multiplexer 2510 such that a sequence consisting of a value of the first start signal xplus[k] and three subsequent zero values (i.e. of the value 0) is supplied to the first low-pass filter LP1 in the first processing branch 2544. Here, the first multiplexer 2510 usually comprises a clock or multiplex rate corresponding to four times a sampling rate of the first start signal. By this, between each sample of the first start signal three zeros are inserted, which leads to an upsampling of the signal. In the first low-pass filter LP1 of the first processing branch 2544 now, for example, on the basis of an FIR filter regulation a low-pass filtering of the upsampled signal takes place in order to suppress resulting image frequencies by upsampling. The low-pass filtered upsampled signal is now subsequently supplied to the first demultiplexer 2522 which supplies the low-pass filtered signal to the partial processing means 2542 of the first processing means 2536 using the high, i.e. four times the sampling frequency as compared to the sampling frequency of the start signal. In the individual partial processing means 2542 of the first processing means 2536 now the multiplication of a signal supplied to the partial means takes place with a multiplication factor. The multiplication factors in the individual partial processing means are here selected such that considering the splitting up of the low-pass filtered signal by the first demultiplexer 2522 and the fourth multiplexer 2516 down-connected downstream from the partial processing means 2524 a signal results at the output 2530 of the fourth demultiplexer 2516 corresponding to an up-converted low-pass filtered signal. The spectral interval between the low-pass filtered signal and the up-converted low-pass filtered signal at the output 2530 of the fourth multiplexer 2516 is here a quarter of the high sampling frequency, i.e. of four times the sampling frequency of the first start signal xplus[k].

An analog processing of the second start signal xzero[k] further takes place in the second processing path 2546, wherein again by the second multiplexer 2512 an insertion of zero values and thus an upsampling of the second start signal xzero[k] takes place. This upsampled signal is now supplied to the second low-pass filter LP2 for removing the image frequencies which resulted from upsampling. In the following, again by the second demultiplexer 2524, the splitting up of the low-pass filtered signal to the partial processing means is performed, wherein a weighting of a signal value with the value 1 takes place. As it was already explained above, such an operation in connection with the function of the second demultiplexer 2524 and the function of the fifth multiplexer 2518 corresponds to a direct "connection" of the low-pass filtered signal onto the output 2532 of the fifth multiplexer 2518.

Analog to the functioning of the signal processing in the first processing path 2544 and the second processing path 2546, now a processing of the third start signal xminus[k] in the third processing branch 2548 takes place. Here, again by the third multiplexer 2514 the third start signal is upsampled, wherein between each sample of the third start signal three zero values are inserted. The thus upsampled third start signal is now low-pass filtered in the third low-pass filter LP3 in order to suppress the image frequencies which resulted by upsampling. Analog to the functioning of the first demultiplexer 2522, the first processing means 2536 and the fourth multiplexer 2516 in the first processing branch 2544, by the third demultiplexer 2526, the third processing means 2540 and the sixth multiplexer 2520 a spectral conversion of the signal low-pass filtered by the third low-pass filter LP3 takes place. By the fact that now in the individual partial processing means of the third processing means 2540 the multiplication factors 1, −j, −1 and j are used in the indicated order, the signal applied at the output 2534 of the sixth multiplexer 2520 corresponds to a signal down-converted by a quarter of the (high) sampling frequency, as it is applied at the output of the third low-pass filter LP3. By the downstream adding means 2528 now the (up-converted) signal applied at the output 2530 of the fourth multiplexer 2516, the signal applied at the output 2532 of the fifth multiplexer 2518 and the (down-converted) signal applied at the output 2534 of the sixth multiplexer 2520 are added. From this, an end signal y[m] results having the possibility to simultaneously send out information on a first (high), a second (intermediate) and a third (low) frequency band. Here, in the first frequency band information of the first start signal xplus[k], in the second frequency band information of the second start signal xzero[k] and in the third frequency band information of the third start signal xminus[k] is contained.

Such a signal converter 2500 has the advantage that this way, in a relatively inexpensive way by the use of the first processing means 2536, the second processing means 2538 and the third processing means 2540, an efficient spectral conversion may be performed. It is a disadvantage of the signal converter 2500, however, that for a realization, as it is illustrated in FIG. 25, a number of nine multiplexers and demultiplexers is required. Thus, a circuit structure as it is illustrated in FIG. 25 requires a high wiring expense and simultaneously a lot of room on an integrated circuit, whereby manufacturing costs of such a signal converter are increased.

SUMMARY OF THE INVENTION

It is thus the object of the present invention to provide a signal converter and a method for converting a signal, wherein for the signal converter or for the method for converting the signal a low expense with regard to the prior art is required.

In accordance with a first aspect, the present invention provides a signal converter for converting a start signal into an end signal, having means for copying the start signal to obtain a plurality of copied start signals, wherein a copied start signal may be fed into a processing branch as a branch signal; first branch processing means in the first processing branch for processing a first branch signal according to a first processing regulation to obtain a first processed branch signal; second branch processing means in a second processing branch for processing a second branch signal according to a second processing regulation to obtain a second processed branch signal, wherein the second processing regulation is different from the first processing regulation, and wherein the first processing regulation and the second processing regulation are implemented to cause a low-pass polyphase filtering of the copied start signals; and selection means for a sequential selection of the first processed branch signal and then of the second processed branch signal in order to obtain the end signal.

In accordance with a second aspect, the present invention provides a method for converting a start signal into an end signal, having the steps of copying the start signal to obtain a plurality of copied start signals, wherein a copied start signal may be fed into a processing branch as a branch signal; processing a first branch signal according to a first processing regulation in first processing means in the first processing branch to obtain a first processed branch signal; processing a second branch signal according to a second processing regulation in second branch processing means in a second processing branch to obtain a second processed branch signal, wherein the second processing regulation is different from the first processing regulation, and wherein the first processing regulation and the second processing regulation are implemented to cause a low-pass polyphase filtering of the copied start signals; and sequential selection of the first processed branch signal and then of the second processed branch signal in selection means in order to obtain the end signal.

In accordance with a third aspect, the present invention provides a computer program having a program code for performing the above-mentioned method, when the computer program runs on a computer.

The present invention is based on the finding that an inexpensive signal converter with regard to the prior art and an inexpensive method for converting a signal with regard to the prior art may be provided by the fact that first using means for copying the start signal is copied, whereupon a plurality of copied start signals results. A first one of the copied start signals is then processed in a first processing branch according to a first processing regulation to obtain a first processed branch signal. Further, a second copied start signal is processed in a second processing means in a second processing branch according to a second processing regulation. If now the first processing regulation and the second processing regulation are implemented such that by both processing regulations a low-pass filtering may be realized, this corresponds to the above-explained low-pass filtering for removing image frequencies occurring in an upsampling of the start signal. If further the first processing regulation and the second processing regulation are coupled with each other so that by the first and the second processing regulation a polyphase filtering may be performed, then the low-pass filter may be provided with less expense here than it is possible in the prior art. For this, for example, the first processing regulation may be implemented to perform a filtering of the first polyphase and the second processing regulation may be implemented to perform a filtering of the second polyphase, wherein the filtering of the two polyphases is possible with a lower clock frequency than in the prior art. Further, first processing means or second processing means may be implemented to perform additional processing operations, wherein the additional processing operation includes a negation, a complex left-hand rotary operation or a complex right-hand rotary operation. By this it is possible, apart from upsampling, to perform a spectral conversion of the (upsampled) start signal into the end signal by the spectral converter. A merging of the first processed branch signal resulting from the first processing means with the second processed branch signal resulting from the second processing means may then take place in selection means for sequentially selecting at the output of which the signal having the (high) sampling frequency is present first. For this, selection means is to be controlled with such a clock which corresponds to the resulting sampling clock of the end signal.

The present invention thus provides the advantage that by copying the start signal and using several copied start signals in processing branches (preferably arranged in parallel) of the signal converter a less expensive realization of the signal converter as compared to a conventional signal converter is possible. In particular by copying and using the copied signals in a polyphase filtering, thus an insertion of zeros into the signal stream of the start signal may be prevented to obtain an upsampled start signal. In this case, thus the multiplexer required in the prior art for inserting the "zeros" may be omitted, whereby already a first contribution to the realization of a less expensive signal converter is done. Further, by splitting a low-pass filter to several polyphase filters it may be achieved that a filtering at a lower frequency as compared to the prior art may be realized, which offers a second contribution to the realization of a less expensive signal converter. This results in particular from the parallel way of processing in a polyphase filter structure.

Further, in each processing branch in addition to a low-pass filtering operation a further processing operation may be performed which may cause a spectral conversion of the start signal. Analog to the multiplication with the multiplication factors of, for example, 1, j, −1 and −j thus in the presence of four processing branches in each processing branch a multiplication with another multiplication factor may take place, whereby finally the frequency shift by a quarter of the sampling frequency in a positive direction may be realized. Alternatively, also with a corresponding selection of the multiplication factors a negative frequency shift may be realized. By the fact that, by using four processing branches also already four polyphase sub-filters are realized by the four processing means, thus further a reduction of the numerical overhead may take place as, for example, no demultiplexer is required to split the low-pass filtered signal up to several partial processing means. Rather, directly a branch signal in a processing branch may be used. Here, simultaneously each of the branch signals may be weighted with a different multiplication factor, whereupon finally the frequency shift (in the positive or negative direction) results. Preferably, such a processing operation may be realized by the fact that a (complex) multiplication with complex multiplication factors does not have to be performed. If the complex signals to be multiplied with the above-mentioned multiplication factors are already present in the form of a real and imaginary part, for example a multiplication with −1 may be performed simply by a negation of the usually binarily presented signal value (i.e. a reversal of sign). Alternatively, in a multiplication with the complex value j a complex left-hand rotary operation may be performed, in which basically a real/imaginary part exchange with a negation of the imaginary part is to be performed. This may be realized in terms of numerics or circuit engineering by a simple "rewiring" or reordering of the individual real or imaginary part values of a present signal in a memory. Analog to this, also in a multiplication with the complex factor −j a complex right-hand rotary operation may be performed, wherein such an operation may again be performed by a real/imaginary part exchange with a negation of the real part.

Further, a further correspondingly connected signal converter may also be connected in parallel to an above-described (first) signal converter. Here, an output signal of the first signal converter is to be summed with an output signal of the second converter to obtain an overall output signal. With such an arrangement, for example, a low-pass filter characteristic of the first signal converter may correspond to a low-pass filter characteristic of the second converter. Further, a set of multiplication factors causing a first (complex) rotary operation in the first signal converter may be different from a set of multiplication factors causing a second (complex) rotary operation in the second signal converter. Such a signal converter having the two individual signal converters connected in parallel has the advantage that by a technically unexpensively realizable circuit construction already a signal converter may be provided converting a frequency multiplexer of a first start signal to the first end signal and of a second start signal to the second end signal, wherein, for example, a start frequency of the first start signal corresponds to a start frequency of the second start signal and an end frequency of the first end signal does not correspond to the second end frequency of the second start signal.

Further, also a third signal converter, as it was described above, may be connected in parallel to the first and second signal converter, whereby an additional degree of freedom results in the design and use of such a signal converter.

According to a further embodiment of the present invention, the signal converter may include further means for copying a second start signal to obtain a plurality of copied second start signals. Additionally, the signal converter may include a branch adder in every processing branch, wherein the branch adder is implemented to add one of the plurality of copied second start signals or a signal derived from the plurality of copied second start signals to the copied start signal in the branch or a signal derived from the copied start signal to obtain an addition signal, and wherein the branch adder is further arranged to process the addition signal according to the processing regulation for the branch. A thus implemented signal converter offers the advantage of a further reduction of the technical effort required for the realization of the signal converter, as for processing and merging the first start signal with the second start signal no two signal converters set up in parallel (comprising two parallel processing branch structures) are required, but that already by the branch adders a merging of signals is possible which are based on the first or the second start signal. The subsequent processing of the merged signal then takes place in only one single processing branch structure with branch processing means arranged in parallel, which, in contrast to the above-illustrated parallel arrangement of two separate signal converters, allows a further reduction of the technical expense. Further, a branch adder may be implemented to cause the signal derived from the copied second start signal to correspond to a second start signal right- or left-hand rotated in the plane of complex numbers. This offers the advantage that in addition to merging the first start signal with the second start signal an individual weighting of the second start signal is possible, whereby an additional flexibility of such a signal converter results.

Further, such a signal converter comprising branch adders may include means for copying a third start signal to obtain a plurality of copied third start signals. Here, the branch adder may be implemented in each processing branch to add one of the plurality of copied third start signals or a signal derived from the plurality of copied third start signals with the copied start signal, the signal derived from the copied start signal, the copied second start signal, the signal derived from the copied second start signal or the addition signal to provide a further addition signal, wherein the branch adder is arranged to process the further addition signal according to the processing regulation for the processing branch. A thus implemented signal converter has an additional degree of freedom due to the possibility of use of a third start signal, and thus comprises an increased flexibility for the area of use of the signal converter.

Further, also two signal converters, as described above, can be arranged cascade-connected, whereby an increase of the frequencies or frequency bands results that may be used by the cascaded arrangement of the signal converters.

BRIEF DESCRIPTION OF THE DRAWINGS

Preferred embodiments of the present invention are explained in more detail in the following with reference to the accompanying drawings, in which:

FIG. 3 shows a tabular illustration of values of the cosine and the sine function as they occur in a positive or negative frequency shift according to the inventive approach;

FIG. 4 shows a tabular illustration of real and imaginary part values in a multiplication of the signal input values according to the approach illustrated in FIG. 5;

FIG. 9 shows a tabular illustration of filter coefficients according to an embodiment of the block illustrated in FIG. 8;

FIG. 12 is a tabular illustration of the word width, data rate and data type of the signals illustrated in FIG. 11A;

FIG. 13 is a tabular illustration of the conversion of an input signal of a block illustrated in FIG. 11A into an output signal of a block using a specified parameter;

FIG. 15 is a tabular representation of word widths, data rates and data types of signals represented in FIG. 14;

FIG. 16 is a tabular illustration of the allocation of signal values to filter coefficients in the time course;

FIG. 17 is a tabular illustration of the allocation of signal values to different polyphases of a polyphase filter;

FIG. 19 is a tabular illustration of the allocation of real or imaginary parts, respectively, of signal values to different polyphases of a polyphase filter;

FIG. 20 is a tabular illustration of an allocation of real and imaginary part values of signal values to polyphases of a polyphase filter;

FIG. 21 is a tabular illustration of the allocation of real and imaginary part values of signal values to individual polyphases of a polyphase filter;

FIG. 22 is a tabular illustration of real and imaginary part values to individual polyphase filters and the resulting result from the polyphase filters;

FIG. 23 is a tabular illustration of a calculation regulation for real and imaginary part values of an output signal of the polyphase filter considering a frequency shift in the positive or negative direction or preventing a frequency shift;

DESCRIPTION OF THE PREFERRED EMBODIMENTS

Figure 1A:
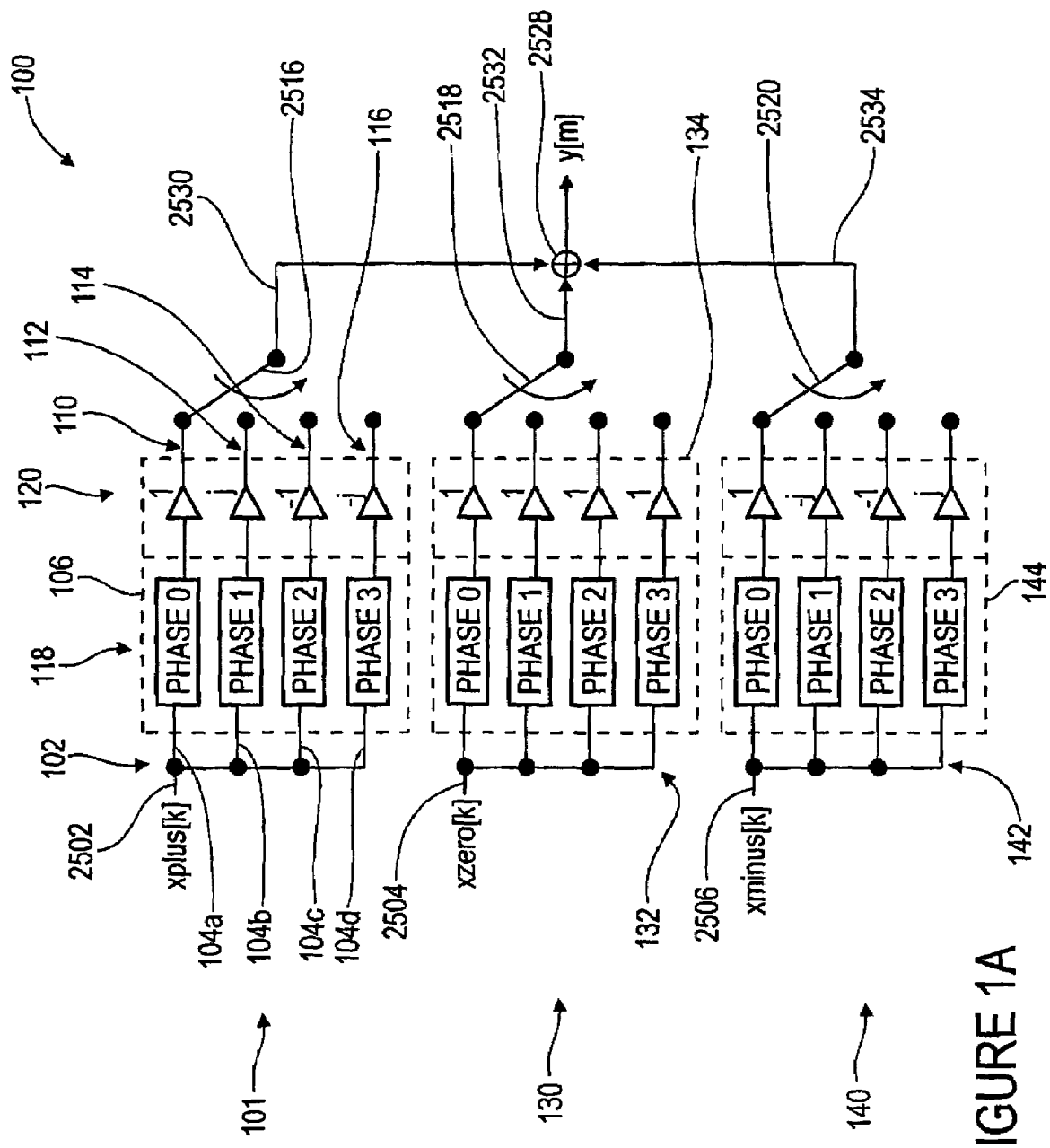
FIG. 1A shows a block diagram of a first embodiment of the inventive signal converter.

In the following specification of the preferred embodiments of the present invention, for like elements illustrated in the different drawings like or similar reference numerals are used, wherein a repeated description of those elements is omitted.

FIG. 1A shows a first embodiment of the inventive signal converter 100. Here, the signal converter 100 again comprises a first start input 2502 for applying a first start signal xplus[k], a second start input 2504 for applying a second start signal xzero[k] and a third start input 2506 for applying a third start signal xminus[k]. Further, the signal converter comprises a first sub-converter 101 having means 102 for copying the first start signal xplus[k] in order to obtain a plurality of copied (first) start signals 104a to 104d. Additionally, the signal copier comprises a first set of branch processing means 106 including four inputs and four outputs. The four outputs of the group of branch processing means 106 may be multiplexed via a multiplexer 2516 to an output 2530 of the multiplexer 2516. The group of branch processing means 106 here includes a first branch processing means in a first processing branch 110, a second branch processing means in a second processing branch 112, a third branch processing means in a third processing branch 114 and a fourth branch processing means in a fourth processing branch 116. Each of those branch processing means includes means 118 for filtering, in particular for low-pass filtering, and means 120 for weighting. Means 118 for filtering may be implemented such that by individual or all means 118 for filtering of the first group of branch processing means 106 a low-pass characteristic is implemented. In other words this means that by means 118 for filtering for example a polyphase filter is realized, wherein means for filtering in the first processing branch 110 includes a polyphase sub-filter having the phase 0, means for filtering in the second processing branch 112 includes a polyphase sub-filter having the phase 1, means for filtering in the third processing branch 114 includes a polyphase sub-filter having the phase 2, and means for filtering in the fourth processing branch 116 includes a polyphase sub-filter with the phase 3. Further, means 120 for multiplying may be implemented to multiply a signal in the first processing branch with the multiplication factor 1 (or as implemented above simply "directly connect"). Means for multiplying in the second processing branch 112 is implemented to determine a result of a complex multiplication with the (purely imaginary) multiplication factor j, wherein means for multiplying in the third processing branch 114 is implemented to perform a negation. Further, means for multiplying in the fourth processing branch 116 is implemented to perform a result of a multiplication with the (purely imaginary) multiplication factor −j.

Analog to this, a second sub-signal converter 130 is set up for converting the second start signal xzero[k]. In particular, the second sub-signal converter 130 again includes means 132 for copying the second start signal xzero[k] to obtain a plurality of copied second start signals. Further, the second sub-signal converter includes a group 134 of branch processing means. Each of the branch processing means of the second group of branch processing means 134 again includes means for filtering 118 and means for multiplying 120. Here again, means for filtering 118 may be implemented in a polyphase structure with the polyphase sub-filters phase 0, phase 1, phase 2 and phase 3. The individual polyphase sub-filters of the second group of processing means may correspond to the respective (i.e. like-designated) polyphase sub-filters of the first group of processing means. In particular, a filter characteristic (for example a low-pass filter characteristic) provided by means 118 for filtering the first group of branch processing means 106 may correspond to a filter characteristic of means 118 for filtering the second group 134 of branch processing means of the second signal converter 130. Then, in particular, filter coefficients of a polyphase filter phase 0 (for example implemented as an FIR filter) of the second group of branch processing means 134 are identical with filter coefficients of the polyphase sub-filter phase 0 (for example also implemented as an FIR filter) of the first group of branch processing means 106. The same also holds true for filter coefficients of the second polyphase sub-filter phase 1, the third polyphase sub-filter phase 2 and the fourth polyphase sub-filter phase 3 in the respective groups of branch processing means. Further, the second group of branch processing means 134 may include means 120 for weighting, wherein in the example illustrated in FIG. 1A means 120 for weighting are implemented in the second group of branch processing means to perform a multiplication of a signal to be processed in the processing branch with the multiplication factor 1.

According to the above implementations, this multiplying with the multiplication factor 1 may also take place by a direct further use of the signal respectively resulting from the polyphase sub-filters. The individual signals determined by branch processing means of the second group 134 may in the following be sequentially multiplexed by a multiplexer 2518 to a multiplexer output 2532.

Analog to this, in FIG. 1A a third sub-signal converter 140 of the signal converter 100 is interconnected with the second sub-signal converter 130 and the first sub-signal converter 101. Here, the third sub-signal converter 140 includes the input 2506 for receiving the third start signal xminus[k], third means for copying 142 to obtain a plurality of copied third start signals, a third group of branch processing means 144, a third multiplexer 2520 for multiplexing branch signals processed by the branch processing means of the third group 144 to an output 2534 of the third multiplexer 2520. Here, again, each of the branch processing means of the third group 144 may include means 118 for filtering and means 120 for multiplying. Means 118 for filtering of the third group of branch processing means 144 may again, as described above, be set up in a polyphase structure having a first polyphase sub-filter phase 0, a second polyphase sub-filter phase 1, a third polyphase sub-filter phase 2 and a fourth polyphase sub-filter phase 3. Further, means 120 for weighting may be implemented to weight a signal to be processed in a first processing branch with a multiplication factor of 1. This weighting may, for example, again, as described above, take place by "directly connecting" the signal. Further, means 120 for weighting in the second processing branch of the third group 144 is implemented to multiply a weighting of a signal to be processed in this processing branch with a (purely imaginary) multiplication factor of −j. Means 120 for weighting in the third processing branch including the third polyphase sub-filter phase 2 is implemented to perform a negation of a signal to be processed in the third processing branch. Finally, means 120 for weighting in the fourth processing branch including the fourth polyphase sub-filter phase 3 is implemented to multiply a signal to be processed in the fourth processing branch with the complex factor j.

Finally, the signal converter 100 also includes an adder 160 for adding a signal applied at the output 2530 of the first multiplier 2516 with a signal applied at the output 2532 of the second multiplexer 2518 and a signal applied at the output 2534 of the third multiplexer 2520 in order to obtain an output signal y[m]. The addition is then performed in samples, i.e. a first value of the signal applied at the output 2530, a second value simultaneously applied with the first value of a signal applied at the output 2532 of the second multiplexer 2518 and a third value simultaneously applied with the first value of a signal applied at the output 2534 of the third multiplexer 2520 are added to each other to obtain a value of the output signal y[m].

Figure 25:
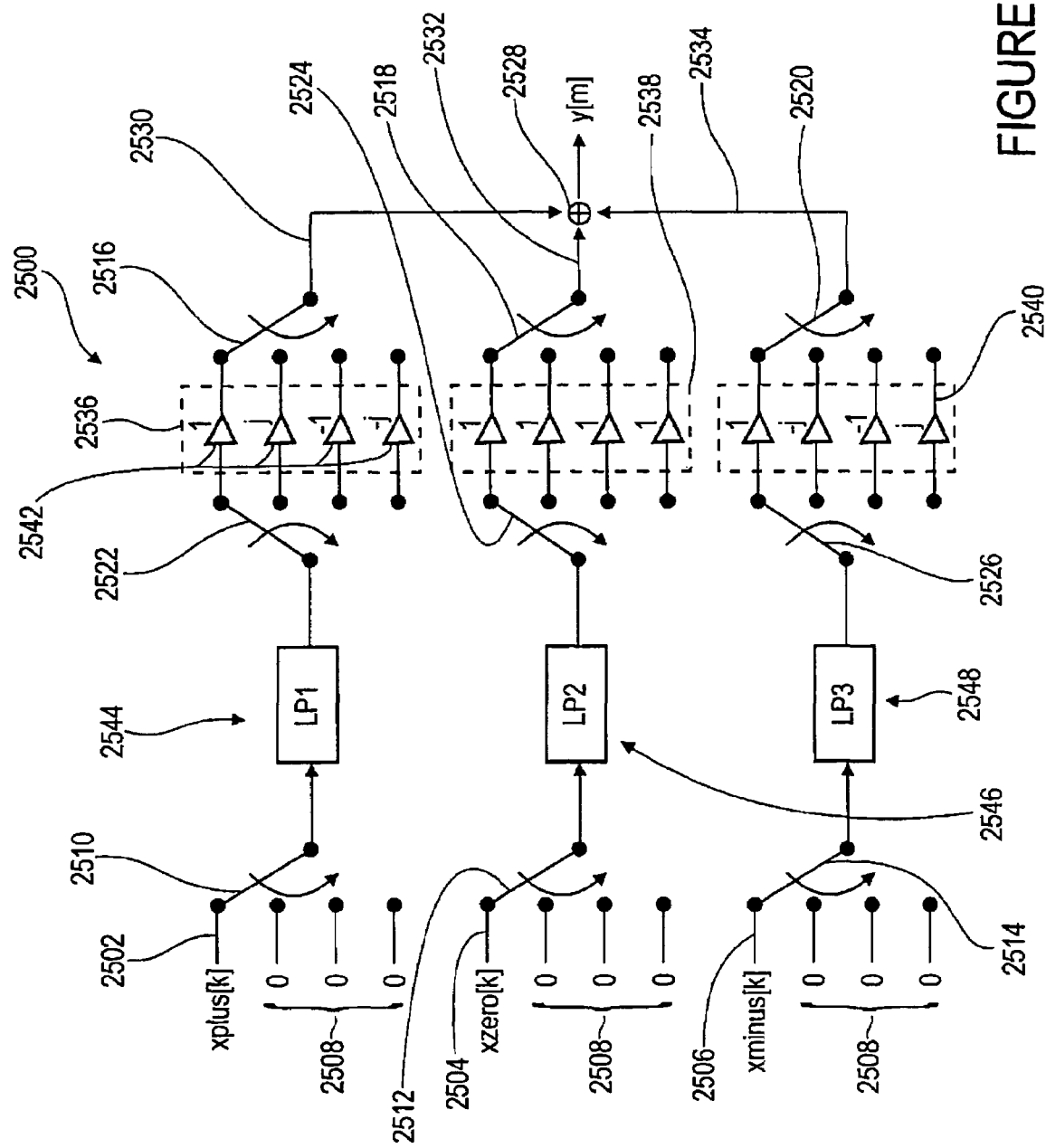
FIG. 25 shows a block diagram of a conventional signal converter.

In contrast to a conventional signal converter, as it is, for example, illustrated in FIG. 25 by the signal converter 2500, the signal converter 100 illustrated in FIG. 1A needs a lower expense in terms of circuit engineering or numerics when the structure of the signal converter illustrated in FIG. 1A is implemented as a software solution. By the fact that by means 102, 132, and 142 for copying a plurality of copied start signals identical with the corresponding start signals is provided and that the implementation of means for filtering 118 of the respective groups of branch processing means are implemented as a polyphase filter structure, already a reduction of the numerical expense compared to the prior art may be achieved, as the multiplexers illustrated in FIG. 25 with the reference numerals 2510, 2512 and 2514 may be omitted. It is further possible to efficiently realize the low-pass filters LP1, LP2 and LP3 by the polyphase filter structure. In particular, the combination of means for copying in connection with the polyphase filter structure thus contributes to a substantial reduction of expenses as compared to the prior art. As in the individual processing branches in the corresponding groups of branch processing means already four sub-signals are present, each sub-signal may be weighted or multiplied by means 120 for weighting or multiplying. Here, by the selection of different multiplication or weighting factors, respectively, in the individual processing branches within a group of branch processing means a complex rotary operation in the form of a multiplication or weighting may be performed with the purely imaginary factors j and −j, as already described above. In particular by the combination of the polyphase filter structure with the multiplication by the (four different) multiplication factors, thus a further reduction of the necessary expense may be achieved such that compared to the signal converter 2500 illustrated in FIG. 25 the demultiplexers designated by the reference numerals 2522, 2524 and 2526 may be omitted. The following interconnection structure, in particular the use of the demultiplexers designated by the reference numerals 2516, 2518 and 2520 and the addition operation using means for adding 2528, corresponds to the signal converter 2500 illustrated in FIG. 25. As a conclusion it may thus be said that by an interconnection structure as it is illustrated in FIG. 1A, by the omission of three multiplexers, three demultiplexers and a more favorable realization of the low-pass filters regarding circuit engineering, a substantial reduction of the technically necessary requirements for the signal converter 100 compared to the conventional signal converter 2500 is possible. Further, by such a less expensive realization of a signal converter, an acceleration of the signal conversion may be performed when the signal converter according to the circuit structure illustrated in FIG. 1A is provided with the same clock rate as the conventional signal converter 2500 illustrated in FIG. 25. Alternatively, however, also the signal converter 100 may be operated with a lower clock rate than the conventional signal converter 2500 which has a further cost-saving and thus expense-reducing effect.

Figure 1B:
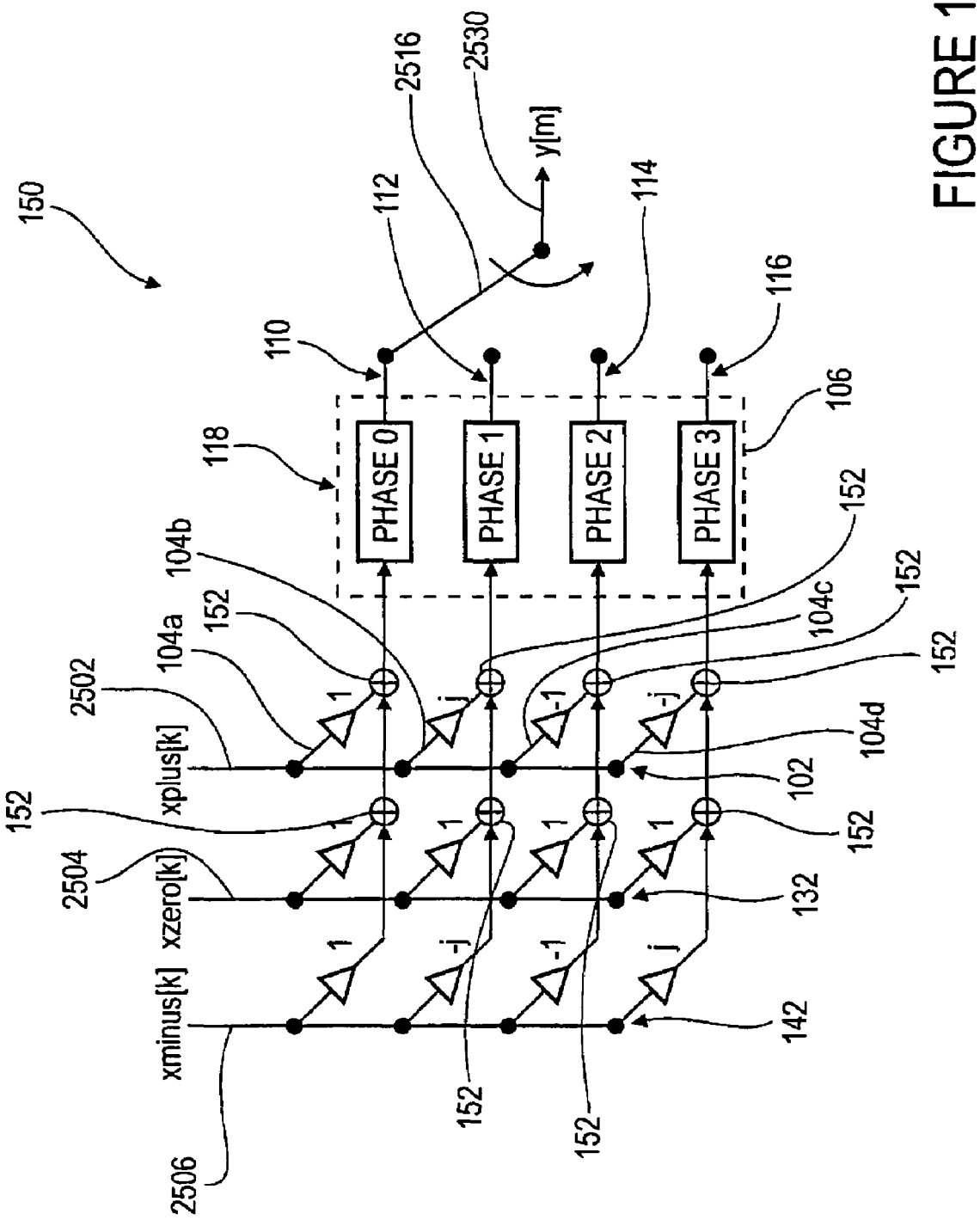
FIG. 1B shows a block diagram of a second embodiment of the inventive signal converter.

FIG. 1B shows a further embodiment of the inventive signal converter 150. The signal converter 150 again comprises a first start input 2502 for providing the signal converter 150 with the first start signal xplus[k], a second start input 2504 for providing the signal converter 150 with the second start signal xzero[k] and a third start input 2506 for providing the signal converter 150 with the third start signal xminus[k]. Further, the signal converter 150 again includes means for copying 102, in order to generate a plurality of copied start signals 104*a-d* (identical with the start signal xplus[k]) from the start signal xplus[k]. Each of the copied start signals 104*a-d* may in the following be fed into one of four processing branches, analog to the first, second, third and fourth processing branches illustrated in FIG. 1A and designated with the reference numerals 110, 112, 114 and 116. In each of the processing branches further again a group of branch processing means is arranged, wherein this group of branch processing means substantially corresponds to means 118 for filtering, in particular for low-pass filtering, illustrated in FIG. 1A. In particular, here also a polyphase structure is implemented, analog to the polyphase structure in FIG. 1A, with the polyphase sub-filters phase 0, phase 1, phase 2 and phase 3. Each of the signals processed in the individual processing branches 110, 112, 114 and 116 may subsequently be multiplexed by a multiplexer, analog to the multiplexer 2516 illustrated in FIG. 1A, onto an output signal 2530 of the multiplexer 2516. With regard to the signal converter 150, however, the output 2530 of the multiplexer 2516 corresponds to the signal output y[m] of the signal converter 150.

Further, each of the copied start signals 104*a* to 104*d* may be weighted by means for multiplexing with a (for example complex) multiplication factor. As an example, the first copied start signal 104*a* may be multiplied (or simply "directly connected") with a factor 1. The second sub-signal 104*b* may be multiplied by means for multiplying with a multiplication factor of j. The third copied start signal 104*c* may be multiplied with a multiplication factor of −1, while the fourth copied start signal 104*d* may be multiplied with a (purely imaginary) complex multiplication factor of −j. Such a multiplication of the four copied start signals 104*a* to 104*d* thus corresponds to a multiplication of start signals, as it is realized by means 101 for multiplying illustrated in FIG. 1A. Such multiplied copied start signals 104 to 104*d* may now further be supplied to a group of branch processing means, analog to the first group of branch processing means 106 in FIG. 1A. According to the signal converter 150 illustrated in FIG. 1B, the group of branch processing means, however, merely includes a plurality of means 118 for filtering, as it is illustrated in FIG. 1A by the polyphase filter structure having the polyphase sub-filters phase 0, phase 1, phase 2 and phase 3; means 120 for multiplying or weighting, respectively, are not contained in the signal converter 150. The functionality and the distribution of filter coefficients to the individual polyphase sub-filters in FIG. 1B may correspond to the functionality and the distribution of filter coefficients to the individual polyphase sub-filters according to FIG. 1A.

In contrast to the structure of a signal converter 100 illustrated in FIG. 1A, thus in the structure of a signal converter 150 illustrated in FIG. 1B addition means 2528 for adding the output signals of the second multiplexer 2518 and the third multiplexer 2520 is omitted. Such a structure having only the one multiplexer 2516 may, however, also be used in an application in which a merging of the (first) start signal xplus[k] with a second start signal xzero[k] is to be performed. In this case, the signal converter 150 comprises further means for copying 132 to obtain a plurality of copied second start signals from the second start signal xzero[k]. These second start signals may now again be fed into respectively one of the processing branches 110, 112, 114 and 116. This feeding in may again take place using weighting means, wherein weighting means is implemented to weight each copied second start signal with a weighting factor that may be fed into a processing branch. In FIG. 1B such a weighting with the weighting factor of 1 was performed for all copied second start signals, which may also be performed by the above-discussed "direct connection" in an efficient way. The weighted copied second start signals may then be added with the weighted copied start signals 104a to 104d in the respective branches by a branch adder in each of the processing branches 110, 112, 114 and 116 to obtain an addition signal. A result of the corresponding branch adders 152 may be placed onto one each of the polyphase sub-filters phase 0, phase 1, phase 2 and phase 3 in one of the processing branches 110, 112, 114 and 116. Such an "anticipation" of the addition before the filtering is possible by the application of regulations for linear systems. Likewise, in an analog way, for example, also the third start signal xminus[k] represented in FIG. 1B may be processed with the second start signal xzero[k] and the first start signal xplus[k]. For this, third means 142 for copying the third start signal xminus[k] is required to provide a plurality of third copied start signals that may be fed into a respective one of the processing branches 110, 112, 114 or 116. In the corresponding processing branches now again a weighting using weighting factors may take place, wherein subsequently the weighted copied third start signals are respectively added with the corresponding weighted copied second start signals or weighted copied first start signals 104a to 104d. In FIG. 1B, for this purpose in each processing branch two branch adders are illustrated; it is also possible, however, to perform an addition using a single branch adder 152 for each branch, if these branch adders then comprise three inputs and one output. By the selection of the corresponding weighting coefficients for the copied start signals in each of the different processing branches it may further be influenced whether the start signal will experience a positive or a negative frequency shift, or whether a frequency shift of the fed-in start signal will not take place. With regard to the selection of the weighting or multiplication factors, the implementations in connection with FIG. 1A and FIG. 25 both apply. Further, also further start signals may be merged to the output signal y[m] in an analog way, wherein in this case it is to be noted, however, that two spectrally shifted start signals may not overlap in the end signal in order not to cause data loss. For this purpose it is necessary that only three start signals may comprise an equal start frequency, wherein each of the start signals then either has to be frequency-shifted in a positive direction, may not be frequency-shifted or has to be frequency-shifted in a negative direction, so that in the output signal y[m] the three start signals are shifted into different spectral bands. If further start signals are to merged onto the end signal it is thus necessary for the further start signals to comprise a start frequency which is different from the first three start signals.

By a structure of a signal converter 150 illustrated in FIG. 1B, in contrast to a structure of a signal converter 100 illustrated in FIG. 1A, a reduction of the technically necessary requirements may be achieved. This results in particular from the fact that only one single group of branch processing means, i.e. means 118 for filtering the polyphase structure having the polyphase sub-filters phase 0, phase 1, phase 2 and phase 3 is required. A double or triple implementation, respectively, of those polyphase sub-filters, as illustrated in FIG. 1A, is thus no longer necessary and is a simplification for the structure of the signal converter to be realized. Further, the provisioning of several multiplexers may be omitted, as only one single multiplexer, as illustrated in FIG. 1B, has to be provided.

This additionally reduces the requirements. To aggravate the situation, now four addition means have to be provided, wherein, however, it is to be noted that an addition means is easier to realize technically than a multiplexer, and thus a circuit with an all in all reduced requirement as compared to the circuit in FIG. 1A is possible. This technical simplification in particular results from the fact that the signal converter proposed here may be operated with a lower clock rate and thus a high clock rate, necessary with regard to conventional signal converters for clocking the multiplexer, may be omitted.

Further, also the signal converters 100 and 150 illustrated in FIGS. 1A and 1B may be cascaded, wherein between the individual cascade stages preferably a sample rate conversion may be introduced. This offers the advantage that by the first stage, for example, three frequency bands considering the positive and negative frequency shift and the "neutral" frequency conversion (i.e. a frequency conversion without spectral shifting of the signal into another frequency band) may be realized, while by the sample rate conversion a further frequency shift may be performed with another shifting interval, whereupon nine obtainable frequency bands may be realized with such a two-stage cascade. A scheme of the frequencies that may be obtained by such a cascaded signal converter is illustrated in FIG. 2.

In this context it is further to be noted that the term of "digital mixing" of a complex baseband signal is the multiplication of a baseband signal with a rotating complex pointer $e^{j2\pi k f_c/f_s}$, wherein k is a running index of a sample of the complex baseband signal (or input signal), $f_c$ is the desired new carrier (i.e. center) frequency and $f_s$ is the sampling frequency. If the special cases $f_c=0$ or $\pm f_s/4$ are selected, then the rotating complex pointer only takes on the values of $\pm 1$ and $\pm j$. When the complex input signal is present in I and Q components, then these multiplications may very easily be achieved by a negation and a multiplexing of the two components, e.g. a multiplication with $-j$ means: $I_{output\ signal} = Q_{input\ signal}$ and $Q_{output\ signal} = I_{input\ signal}$. With this above-illustrated principle, a mixing onto three frequency sub-bands with the center frequencies $f_c=0$, $f_c=+f_s/4$ and $f_c=-f_s/4$ may be realized.

Figure 2:
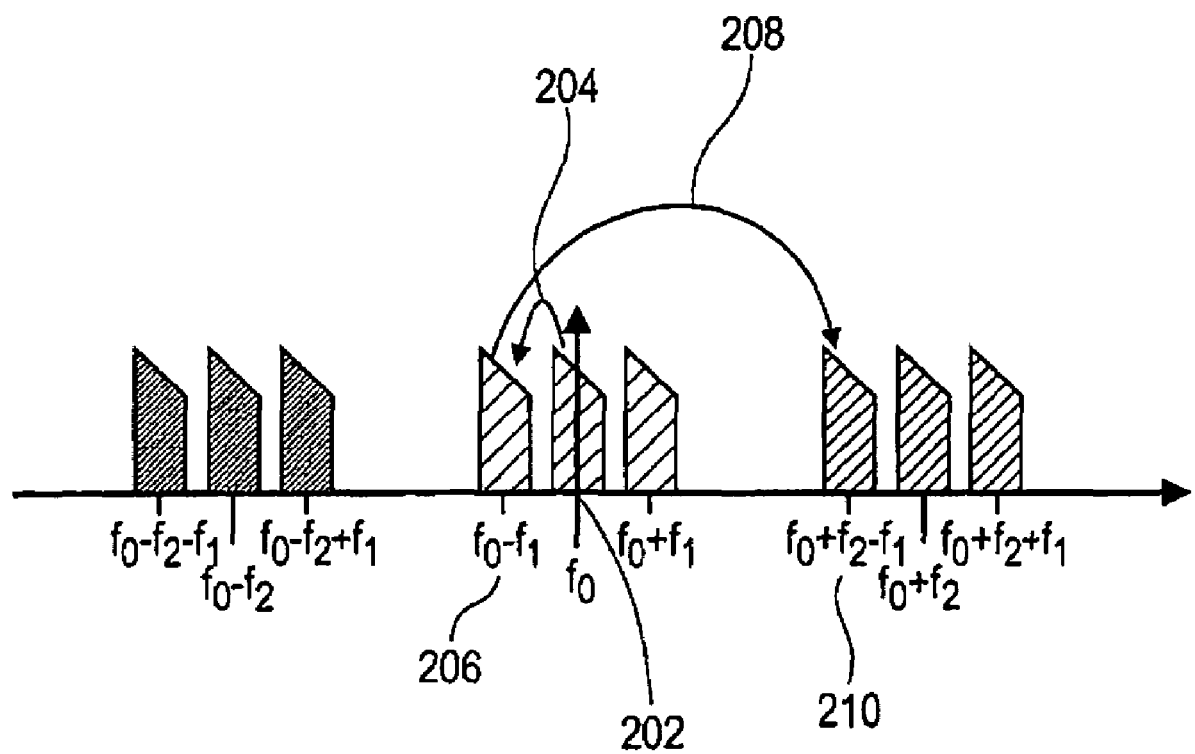
FIG. 2 shows an illustration of the obtainable target frequencies with a cascade-connection of several signal converters.

Using a frequency distribution illustrated in FIG. 2, a possible up- and down-conversion is to be explained in more detail by the cascading of several signal converters. In this connection it is to be noted that a down-conversion only serves for illustration purposes, that the inventive approach, however, substantially relates to up-conversion.

In order to be able to use such an above-described digital mixing which is simple to realize for an up-conversion, now a cascade-connection of the mixers explained in more detail above may be performed, wherein before a mixing with the second of the cascaded mixers a conversion of the sampling frequency takes place. For such a cascaded mixer, for example in the first mixer stage, the input signal having a first (low) sampling frequency $f_{s1}$ may be brought onto the center frequencies $f_{c1}=0$, $f_{c1}=+f_{s1}/4=+f_1$ or $f_{c1}=-f_{s1}/4=-f_1$ by the first mixer.

Subsequently, an upsampling (i.e. a sampling frequency increase), for example by the factor 4 onto a second (higher) sampling frequency $f_{s2}$ takes place. Part of the generation of the $f_{s2}$ samples is here preferably an insertion of "0" values (samples) after each $f_{s1}$ sample (i.e. for this example with $f_{s2}=4*f_{s1}$ an insertion of three "0" values). In the following, a low-pass filtering is performed in order to preserve only the upsampled $f_{s1}$ signal and not its spectral images (i.e. its spectral image frequencies resulting in upsampling) at multiples of the first sampling frequency $f_{s1}$. Subsequently, again a digital mixing may be performed, this time onto the center frequencies $f_{c2}=0$, $f_{c2}=+f_{s2}/4=+f_2$ or $f_{c2}=-f_{s2}/4=-f_2$. Altogether, in this way, based on a signal in the current frequency, nine different center frequencies $f_c$ in relation to the current frequency $f_0$ may be obtained:

$f_c=f_0-f_2-f_1$, $f_c=f_0-f_2+0$, $f_c=f_0-f_2+f_1$, $f_c=f_0-f$, $f_c=f_0$, $f_c=f_0+f_1$, $f_c=f_0+f_2-f_1$, $f_c=f_0+f_2$, and $f_c=f_0+f_2+f_1$. Such a frequency distribution is illustrated as an example in FIG. 2.

A mixer may now, for example, mix a signal of the current frequency $f_0$ 202, i.e. the center frequency $f_c=f_0$ by a first mixing 204 to the center frequency $f_c=f_0-f_1$. Subsequently, after an upsampling an increase of the sampling frequency takes place, whereupon a mixing 208 of the signal now located in the intermediate frequency with the center frequency $f_c=f_0-f_1$ onto the target frequency 210 with the center frequency $f_c=f_0+f_2-f_1$ may be performed.

From the illustration according to FIG. 2 it may be seen that also further mixers may be cascade-connected. By this it is possible to shift a signal having a current frequency, for example, to 27 center frequencies, if a three-stage mixer arrangement is realized, or to shift a signal having a current frequency to 81 center frequencies when a four-stage mixer arrangement is realized. Such a cascade may now be continued randomly, wherein a number of obtainable center frequencies is designated by the term $3^x$ and wherein x is the number of cascaded mixers.

Analog to the up-conversion in the transmitter, the down-conversion in the receiver is performed by a rotating complex pointer $e^{j2\pi k f_c/f_s}$. Just like in the transmitter, thus for $f_c=0$ and $\pm f_s/4$ the down-conversion may be achieved by negating and multiplexing of the I and Q components. In this way, likewise three frequency sub-bands may be obtained. Analog to the cascading of mixer stages in the transmitter, again a cascading of mixers may take place like, for example, of the frequency converters shown in FIGS. 1A and 1B, whereby the number of frequency bands may be increased which may easily be separated numerically or in circuit engineering. Assuming, for example, the sampling frequency at the receiver input is equal to $f_{s2}$ and the center frequency of the received signal is $f_c=f_0-f_2-f_1$, $f_c=f_0-f_2+0$, $f_c=f_0-f_2+f_1$, $f_c=f_0-f_1$, $f_c=f_0$, $f_c=f_0+f_1$, $f_c=f_0+f_2-f_1$, $f_c=f_0+f_2$, or $f_c=f_0+f_2+f_1$. Altogether, nine frequency sub-bands may be separated. All of those center frequencies are converted by frequency conversion with 0 or $\pm f_{s2}/4=\pm f_2$, respectively, to the center frequencies $f_c=0$ or $f_c=\pm f_{s1}/4=\pm f_1$, respectively.

During the frequency conversion, in a frequency converter simultaneously a downsampling from the (higher) sampling frequency $f_{s2}$ to the (lower) sampling frequency $f_{s1}$ may take place, wherein analog to the above-mentioned example the lower sampling frequency is $f_{s1}=f_{s2}/4$. Here, preferably the signal present at the high sampling frequency $f_{s2}$ is low-pass filtered in means for weighting in the frequency converter in order to mask out the resulting image frequencies in downsampling. Then, again a mixing with 0 or $\pm f_{s1}/4=\pm f_1$ may take place, so that finally the signal is at the center frequency $f_0$. For example, the receive signal may be at a center frequency $f_c=f_0+f_2-f_1$, as it illustrated by the center frequency 210 in FIG. 2. By the first frequency converter, then a conversion which is inverse to the mixing 208 may take place, wherein the signal is then applied to a center frequency 206 of $f_c=f_0-f_1$. Simultaneously to the frequency conversion, in the frequency converter, as indicated above, again a downsampling may take place. The now downsampled signal at the center frequency 204 of $f_c=f_0-f_1$ may then be converted to the center frequency 202 of $f_c=f_0$ by a frequency converter corresponding to the second mixer in a mixing which is inverse to the mixing 204.

The receive signal with the high sampling frequency is thus converted from the current frequency to a quarter of the current frequency by the sample rate reduction in the frequency converter. If further a spectral conversion of the current frequency by a quarter of the high sampling frequency takes place, then after the sampling rate reduction an output signal of the first frequency converter results in which the center frequency, apart from the reduction to a quarter of the current frequency, depending on the offset direction of the spectral conversion, is reduced or increased by one sixteenth of the sampling frequency.

Analog to the above implementations, also more than nine frequency sub-bands (for example 27, 81 frequency sub-bands) may be received or separated in the above-described way, if a corresponding number of mixer stages or frequency converter stages, respectively, are cascaded.

In the following, the mathematical basics of the frequency shift easy to realize in terms of numerics or circuit engineering are to be explained in more detail. In the continuous range, a frequency shift is achieved by the application of the formula $$f(t)*e^{j\omega_0 t}$$

which corresponds to a frequency shift $F(j(\omega-\omega_0))$ in the positive direction. The conversion into the discrete time range is as follows:

$$f[n]*e^{jn2\Pi f/T_s}.$$

In particular, the case of a frequency shift by $f_s/4$ (which corresponds to a rotation by $\Pi/2$) is regarded more closely.

If for f $f_s/4$ is substituted in the above formula, wherein $f_s$ is the sampling frequency (i.e. the spectrum is shifted in the "positive" direction), using $f_s=1/T_s$ the following is obtained:

$$f[n]*e^{jn2\pi(1/(4T_s))T_s}=f[n]*e^{jn\pi/2}=y[n]$$

If for an input signal $f[n]=i[n]+j*q[n]$ holds true, then using the Euler formula for the exponential expression (i.e. $e^{jn\pi/2}=\cos(n\Pi/2)+j*\sin(n\Pi/2)$) terms for the real and imaginary part of y[n] are obtained $$Re\{y[n]\}=i[n]*\cos(n\Pi/2)-q[n]*\sin(n\Pi/2)$$

$$Im\{y[n]\}=i[n]*\sin(n\Pi/2)+q[n]*\cos(n\Pi/2).$$

For a frequency shift in the positive direction (i.e. a frequency shift of the input signal toward a higher frequency of the output signal) the argument is positive, while in a frequency shift in the negative direction (i.e. a frequency of an input signal is higher than a frequency of the output signal) the argument of the sine and cosine function is negative. A tabular illustration of the value pairs of the terms cos (n$\Pi$/2) and sine (n$\Pi$/2) for different time index values n is illustrated in FIG. 3. Here, the above-mentioned terms for the sine and cosine function are respectively listed for a positive or negative frequency shift, wherein as a time index the values n=0, 1, 2 and 3 are used as a basis.

Based on the table illustrated in FIG. 3 and the above formula, a frequency shift of the input signal f[n] by $f_s/4$ results for a complex input signal i[n]+j*q[n], as it is indicated in the tabular representation in FIG. 4. As it may be seen, the respective values for the real and imaginary parts of the positive and negative shifts for all odd indices are only different regarding their sign. Apart from that it is to be noted, that with all odd time indices the imaginary part value q[n] of the input signal f[n] is allocated to the real part value of the output signal y[n] either directly or in a negated form. Further, for each odd time index the real part value i[n] of an input signal f[n] is allocated to the imaginary part value of an output signal y[n] of the corresponding time index n either directly or in a negated form. The real and imaginary part values of the output signal y[n] of a mixer may thus be regarded as result values of a complex multiplication of an input value f[n] with a complex-value multiplication factor.

Figure 5:
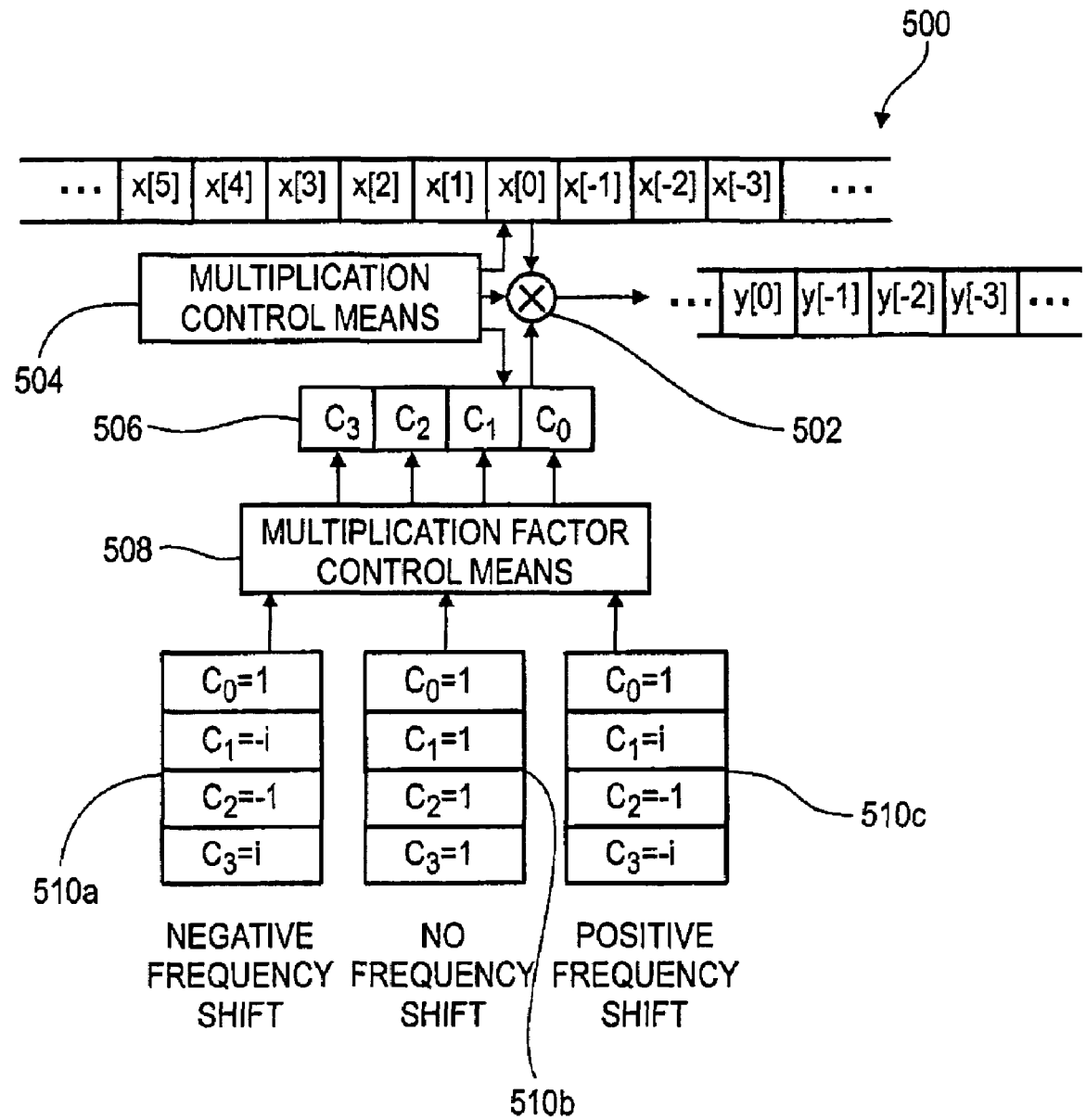
FIG. 5 shows a block diagram of the approach of the multiplication of a signal value with a set of multiplication factors.

Such a multiplication may, for example, be achieved by a multiplication device 500 as it is illustrated in FIG. 5. Such a multiplication device 500 includes a multiplication element 502, a multiplication control means 504, a multiplication factor register 506 with several multiplication factors $c_0$, $c_1$, $c_2$ and $c_3$. A first multiplication factor set 510a (with the coefficients $c_0=1$, $c_1=-i$, $c_2=-1$, $c_3=i$) corresponds to a negative frequency shift, a second multiplication factor set 510b (with the coefficients $c_0=1$, $c_1=1$, $c_2=1$, $c_3=1$) corresponds to a mixing in which no frequency shift takes place, while a third multiplication factor set 510c (with the coefficients $c_0=1$, $c_1=i$, $c_2=-1$, $c_3=-i$) corresponds to a mixing with a positive frequency shift. Further, input signals x[n], wherein n=−3, −2, −1, 0, 1, 2, 3, 4, 5, . . . , may be supplied to the mixer 500. As a result, the mixer 500 may output output values y[n], wherein n=−3, −2, −1, 0, . . . .

The functioning of the mixer 500 illustrated in FIG. 5 may now be described as follows. First, according to a desired frequency shift (for example using a control signal at the control input of the mixer 500 not illustrated in FIG. 5, using which the direction of the frequency shift may be set) one of the multiplication factor sets 510 is loaded into the multiplication factor register 506 for storing the used multiplication factor set with the help of the multiplication factor control means 508. If the mixer 500, for example, is to perform a positive frequency shift by a quarter of the sampling frequency, then the coefficient set 510c is loaded into the register 504. In order now to perform the frequency shift, an input value, for example the value x[0], is loaded into the multiplier 502 and is multiplied in the multiplier with the coefficient $c_0=1$, from which the result y[0] results. In a multiplication with the multiplication factor $c_0=1$ no negation or exchange of the real and imaginary parts of the complex signal input value x[0] results. This is also illustrated in the corresponding line of the table in FIG. 4, in which the real and imaginary parts in a positive frequency shift are shown for the time index 0 and show no change of the real or imaginary part.

As the next element, the subsequent input value x[1] is loaded into the multiplier 502 and multiplied with the multiplication factor $c_1$ (=i). From this, an output signal value results (i.e. a value y[1]), in which the real part of the input value is associated with the imaginary part of the output signal value and the imaginary part of the input value is negated and associated with the real part of the output value, as it is indicated in FIG. 4 in the line corresponding to the time index n=1 for a positive frequency shift.

Analog to this, in the multiplier 502 a multiplication of the next subsequent signal input value x[2] with the multiplication factor $c_2$ (=−1) and the again subsequent signal value x[3] with the multiplication factor $c_3$ (=−i) results. From this correspondingly the values indicated in FIG. 4 for the real and imaginary part of the corresponding output values y[n] result for n=2 and 3 according to the allocation in the column for a positive frequency shift.

The subsequent signal input values may be converted to corresponding signal output values y[n] by a cyclic repetition of the above-described multiplications using the multiplication factor stored in the register 506. In other words, it may thus be said that a positive frequency shift by a quarter of the sampling frequency which the input signal x is based on may be performed by a multiplication with a purely real or a purely imaginary multiplication factor (wherein the multiplication factors preferably have an equal magnitude of, for example, the value 1), which again leads to the simplification that the multiplication may be performed merely by the exchange of real and imaginary part values and/or a negation of the corresponding values. Performing the multiplication itself is thus not necessary any more, and the result of the multiplication may rather be determined by those negation or exchange steps.

For a negative frequency shift, the use of the mixer 500 may be performed in an analog way, wherein now the multiplication factor set 510a is to be loaded into the register 506. In an analog way also a mixing may be performed, in which no frequency shift is performed when the multiplication factor set 510b is loaded into the register 506, as here only a signal input value x is multiplied with the neutral element of the multiplication (i.e. with a value 1), whereby the value of the input signal value x to the output signal value y does not change.

In the following, for reasons of clarity of the overall system, both an upsampling and a frequency allocation is to be explained in more detail, as it is, for example, found in a transmitter, as well as a corresponding implementation of the receiver suitable for this transmitter. It is to be noted here as well, that the inventive concept mainly refers to the transmitter, i.e. the up-converter. A description of the downsampling contributes to a better understanding of the overall system, however, and a more detailed description of the downsampling is enclosed here for this reason.

Figure 6:
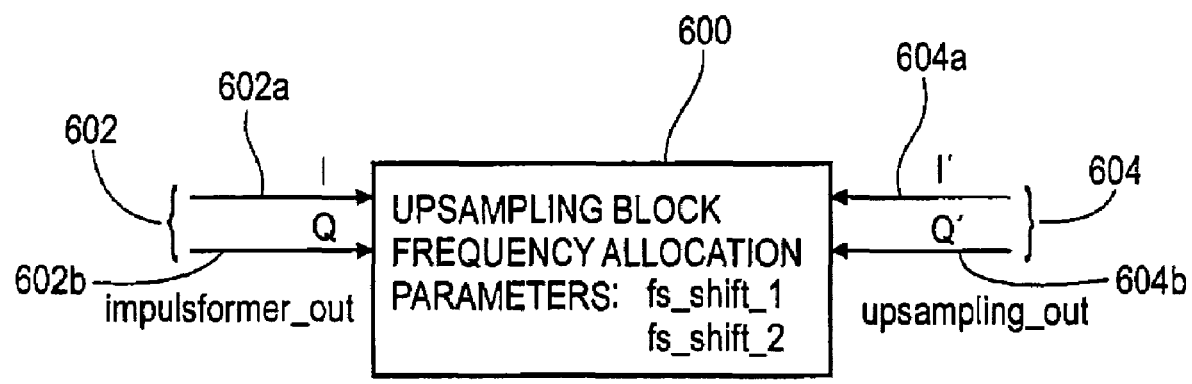
FIG. 6 shows a block diagram of an upsampler which may be used in connection with the inventive approach.

For describing the upsampling, the mixer may be illustrated as an upsampling block 600, as it is shown in FIG. 6. The upsampling block 600 here comprises an input interface 602, via which the upsampling block 600 receives complex input data present in the form of an I component 602a and a Q component 602b. This complex input data is, for example, output by an impulse former (not illustrated), which is why input data or the input data stream, respectively, is also designated in FIG. 6 by the term "impulseformer_out". Further, the upsampling block 600 includes an output interface 604 for outputting the upsampled data, wherein the output interface 604 again includes a first component I' 604a and a second component Q' 604b. As the output data or the output data stream, respectively, is upsampled data, this data stream is also designated by "upsampling_out". In order to enable a frequency allocation, i.e. a frequency shift of the center frequency of the data stream "impulseformer_out" to a center frequency of the data stream "upsampling_out", in the upsampling block 600 the parameters fs_shift_1 and fs_shift_2 are used corresponding to the frequency f1 (=fs_shift_1) and f2 (=fs_shift_2) of FIG. 2.

Regarding the input data stream impulseformer_out it is further to be noted that the same, for example, comprises a word width of 8 bits per I or Q component, a data rate of $B_{13}$ Clock_16 (i.e. one sixteenth of the data rate of the output data stream), wherein the data type of the input data is to be regarded as complex-valued. It is further to be noted regarding the output data stream upsampling_out, that its word width, for example, includes 6 bits per I and Q component. Apart from that, the output data stream upsampling_out comprises a data rate of B_Clock defining the highest data rate or clock frequency, respectively, of the upsampling block 600 regarded here. Apart from that, the data type of the data of the output data stream upsampling_out is to be regarded as a complex data type.

From outside, only the two used frequency parameters fs_shift_1 and fs_shift_2 are transferred to the upsampling block 600. The same determine the conversion of the generated baseband signals (i.e. of the signals contained in the input data stream impulseformer_out) onto an intermediate frequency of [−B_Clock_16, 0, B_Clock_16], at a sampling rate of B_Clock_4 (parameter fs_shift_1) or a conversion to an intermediate frequency of [−B_Clock_4, 0, B_Clock_4] with a sampling rate of B_Clock (parameter fs_shift_2). The sampling rate B_Clock_4 here designates a quarter of the sampling rate or the sampling clock of B_Clock, respectively.

Figure 7:
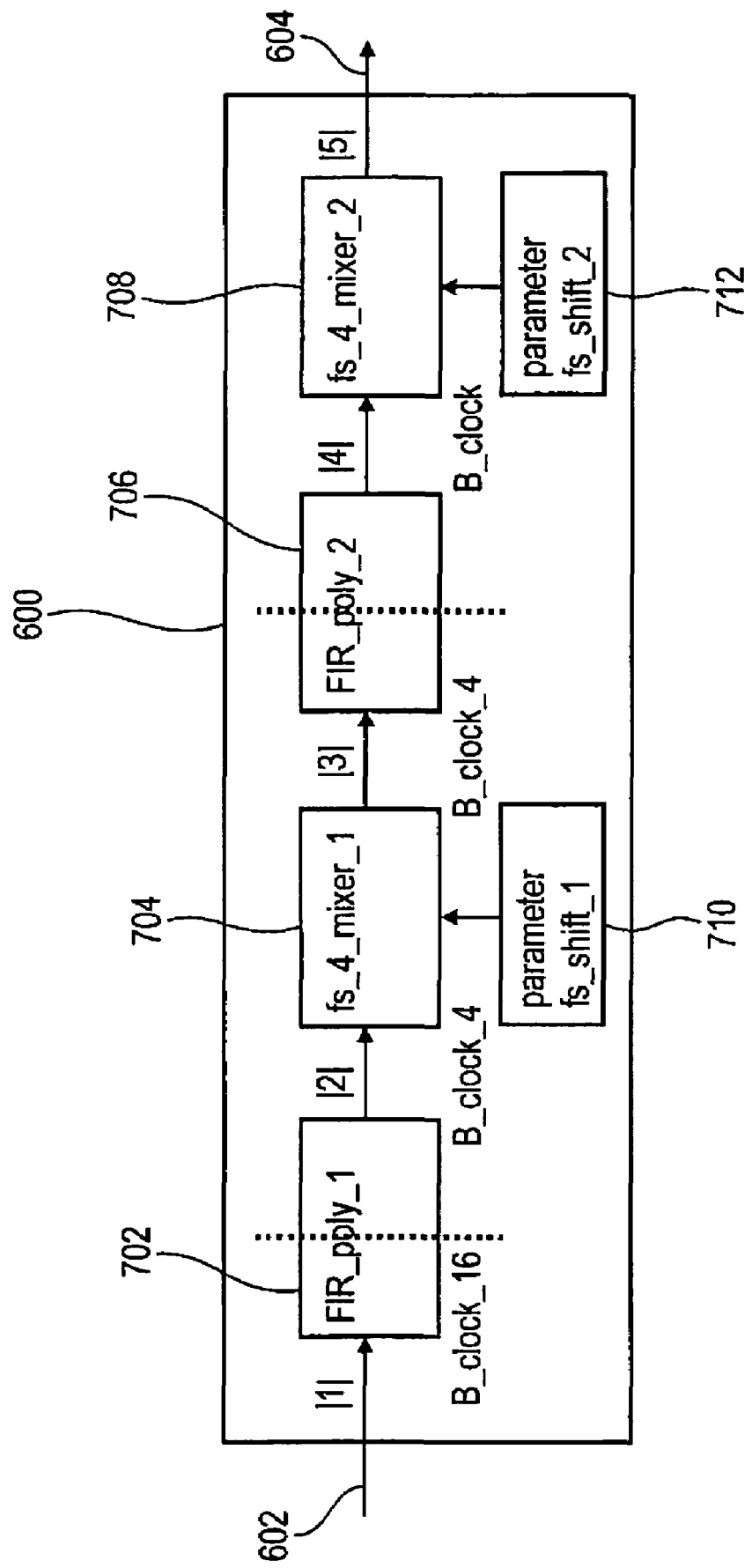
FIG. 7 shows a block diagram representing a detailed illustration of the block shown in FIG. 6.

FIG. 7 shows a detailed block diagram of the upsampling block 600 illustrated in FIG. 6. The upsampling block 600 may be designated as a mixer. The mixer 600 includes a first polyphase filter 702, a first mixer 704, a second polyphase filter 706, a second mixer 708, a first parameter set 710 and a second parameter set 712. The first polyphase filter 702 includes an input for receiving the input data stream impulseformer_out, equivalently designated by the reference numeral 602 or the reference numeral |1|. The input of the first polyphase filter (which is, for example, implemented as an FIR filter) is thus directly connected to the input 602 of the mixer 600. Further, the first polyphase filter is connected to the first mixer 704 via the port FIR_poly_1_out |2|. Further, the first mixer 704 is connected to an input of the second polyphase filter 706 via the port fs_4_mixer_1_out |3|. The second polyphase filter 706 further comprises an output connected to an input of the second mixer 708 via the port FIR_poly_2_out |4|. further, the second mixer 708 comprises an output connected to the output interface 604 of the mixer 600 via the port upsampling_out |5|. This port thus forms the output of the overall upsampling block 600 and is directly connected into the next higher hierarchy level. Further, the mixer 600 includes the first coefficient set 710 associated with the first mixer 704 and the second coefficient set 712 associated with the second mixer 708. The coefficients fs_shift_1 of the first coefficient set 710 and fs_shift_2 of the second coefficient set 712 are thus only correspondingly passed on to the two blocks fs_4_mixer_1 (i.e. the first mixer 704) or fs_4_mixer_2 (i.e. the second mixer 708), respectively. Further parameters are not contained in this embodiment of the mixer 600.

It is further to be noted that the data stream designated by the reference numeral |1| comprises data with a word width of 8 bits per I and Q component, wherein the data with a data rate of B_Clock_16 (i.e. a sixteenth of the clock B_Clock) are supplied to the first polyphase filter 702. Apart from that, the data supplied to the first polyphase filter comprise a complex-value data type. In the first polyphase filter 702 (which is preferably implemented as an FIR filter) an increase of the sampling clock is performed, for example, from B_Clock_16 to B_Clock_4, which corresponds to a quadruplication of the sampling clock. By this, the signal FIR_poly_1_out designated by the reference numeral |2| distinguishes itself by the fact that the word width is also 8 bits per component and the data type is also to be regarded as complex-valued, and that the data rate was now increased to B_Clock_4, i.e. to a quarter of the maximum clock B_Clock.

In the first mixer 704 using the parameter set 710 for the parameter fs_shift_1 a frequency conversion takes place, wherein a difference between a center frequency of the signal designated by the reference numeral |2| and a center frequency of the signal designated by the reference numeral |3| corresponds to a quarter of the sampling clock rate B_Clock_4. Thus, it may be noted that the signal with the reference numeral |3| was shifted to a higher intermediate frequency than the signal FIR_poly_1_out, wherein a word width of the signal fs_4_mixer_1_out is 8 bits per component, the data type is complex-valued and the data rate is B_Clock_4.

Further, in the second polyphase filter 706 (for example also including an FIR filter) a further upsampling is performed such that the signal FIR_poly_2_out designated by the reference numeral |4| comprises a sampling rate or data rate of B_Clock (i.e. the maximum achievable sampling rate in the mixer 600). The word width of the signal FIR_poly_2_out is here also 8 bits per I and Q component, while the data type of this signal is also complex-valued. Subsequently, by the second mixer 708, which is also a mixer with a frequency shift by a quarter of the supplied sampling frequency, a frequency conversion of the signal FIR_poly_2_out takes place, also designated by the reference numeral |4|, to the signal upsampling_out, also designated by the reference numeral |5|. Here, the parameter set 712 is used, for example, indicating a direction in which the frequency shift is to be performed. The signal upsampling_out may comprise a word width of 6 bits per I and Q component, for example predetermined by an external upsampling filter. The data rate of the signal upsampling_out is B_Clock, while the data type is again complex-valued.

In the following, the basic functioning of block FIR_poly_1 (i.e. of the first polyphase filter 702) and block FIR_poly_2 (i.e. of the second polyphase filter 706) is described in more detail. Each of those blocks, in the present embodiment, causes a quadruplication of the sampling rate with a simultaneous maintenance of the signal bandwidth. In order to upsample a signal by the factor 4, between each input sample three zeros are to be inserted ("zero insertion"). The now resulting "zero-inserted" sequence is sent through a low-pass filter in order to suppress the image spectrums at multiples of the input sampling rate. According to principle, here all used filters are real, i.e. comprise real-valued coefficients. The complex data to be filtered may thus always be sent through two parallel equal filters, in particular a division of a signal into an I component (i.e. a real part of the signal) and a Q component (i.e. an imaginary part of the signal), respectively only comprising real values, is in this case clearly simplified, as a multiplication of real-value input signals with real-value filter coefficients is numerically substantially more simple than multiplications of complex-valued input values with complex-valued filter coefficients.

Some known characteristics of the input signal or the spectrum to be filtered, respectively, may be used to further minimize the computational overhead. In particular, by a polyphase implementation and a use of the symmetry of sub-filters of the polyphase implementation, advantages may be used, as it is explained in more detail below.

A polyphase implementation may preferably be used, as the input sequence only comprises a value different from 0 at every fourth digit, as described above. If an FIR filter in a "tapped delay line" structure is assumed, then for the calculation of each output value only L/R coefficients are used (L=FIR filter length, R=upsampling factor). The used coefficients repeat periodically after exactly R output values. Thus, such an FIR filter may be divided into R sub-filters of the length L/R. The outputs of the corresponding filters then only have to be multiplexed in the correct order to a higher-rate data stream. Further, it is to be noted that a realization of the FIR filter, for example with the function "intfilt" of the software tool MATLAB, leads to a regular coefficient structure for the second sub-filter (i.e. the second sub-filter comprises an even length and an axial symmetry). Further it may be seen that the fourth sub-filter may approximately be reduced to one single delay element, as it is indicated in more detail below.

Figure 8:
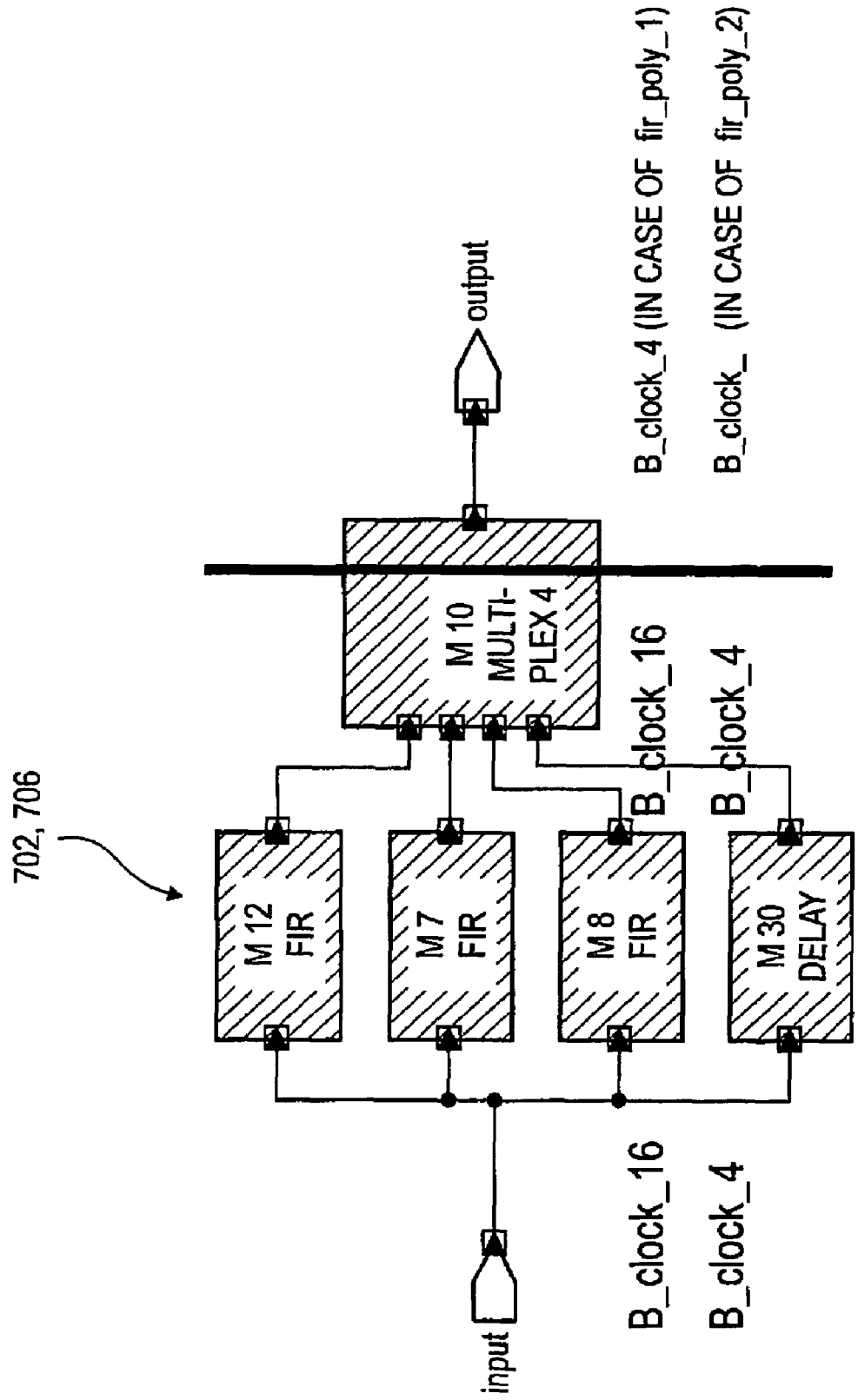
FIG. 8 shows a block diagram representing a detailed illustration of the block illustrated in FIG. 7.

A block diagram of a concrete realization of a polyphase filter, like, for example, of the first polyphase filter 702 or of the second polyphase filter 706 is indicated as an example in FIG. 8. Such a polyphase filter includes an input, a first FIR filter M12, a second FIR filter M7, a third FIR filter M8, a delay element M30, a four-to-one multiplexer M10 and an output. The first FIR filter M12, the second FIR filter M7, the third FIR filter M8 and the delay element M30 respectively comprise an input and an output, wherein the input of each of the four mentioned elements is connected to the input of the polyphase filter. The four-to-one multiplexer M10 comprises four inputs and one output, wherein each of the four inputs is connected to one output of one of the FIR filters M12, M7, M8 or the output of the delay element M30. Further, the output of the four-to-one multiplexer M10 is connected to the output of the polyphase filter. An input data stream which is fed to the polyphase filter 702 or 706, respectively, via the input of the same, is thus put in parallel onto four FIR filters (i.e. after the reduction of the sub-filter 4 to one delay element only to the three FIR filters M12, M7 and M8) and is then again multiplexed by the four-to-one multiplexer M10. By this parallelization, a change of the port rates between the input of the polyphase filter and the output of the polyphase filter by the factor of 4 is achieved.

In a use of the structure illustrated in FIG. 8 for the first polyphase filter, i.e. the polyphase filter FIR_poly_1 illustrated in FIG. 7, this means an increase of the data rate from B_Clock_16 to B_Clock_4. For the case of using the figure illustrated in FIG. 8 for the second polyphase filter 706, i.e. the filter FIR_poly_2 illustrated in FIG. 7, this means a data rate increase from B_Clock_4 to B_Clock. It may further be noted that such a filter, in particular the filter coefficients, may for example be generated using the command coeff=intfilt (4, 6, ⅔) of the software tool MATLAB.

FIG. 9 shows a tabular representation of filter coefficients $a_0$ to $a_{46}$, as it may be obtained using the above-mentioned command with the software tool MATLAB. To the individual sub-filters, i.e. the first FIR filter M12, the second FIR filter M7, the third FIR filter M8 and the delay element, now different coefficients of the coefficient set of the filter coefficients $a_0$ to $a_{46}$ illustrated in FIG. 9 may be allocated. For example, the coefficients $a_0, a_4, a_8, a_{12}, \ldots$ may be allocated to the first FIR filter M12. This may again be performed using a MATLAB command coeff1=coeff(1:4:end). The coefficients $a_1, a_5, a_9, a_{13}, \ldots$ may be allocated to the second FIR filter M7, as it is, for example, possible using the MATLAB command coeff2=coeff(2:4:end). The coefficients $a_2, a_6, a_{10}, 1_{14}, \ldots$ may be allocated to the third FIR filter M8, as it is, for example, possible using the MATLAB command coeff3=coeff(3:4:end). The coefficients $a_3, a_7, a_{11}, a_{15}, \ldots$ may be allocated to the fourth FIR filter (which may, for the reasons described below, be reduced to a delay element), as it is, for example, possible using the MATLAB command coeff4=coeff(4:4:end).

As it may be seen from the tabular illustration in FIG. 9, the coefficients allocated to the fourth sub-filter approximately comprise the value 0, except for the coefficient $a_{23}$, approximately comprising the value of 1. For this reason, neglecting the coefficients approximately having the value 0, the fourth sub-filter may be changed to a delay structure, as the coefficient set of the fourth sub-filter coeff4 is occupied by a value of approximately 1 (see $a_{23}$) only at digit 6 (sixth element of the coefficient set in the MATLAB count). Thus, this block may be replaced by a delay element with delay=5, which corresponds to a shift of the input value by five elements. Further, the coefficient set coeff2, associated with the second sub-filter M7, comprises an axial-symmetrical structure and an even length, whereby this FIR filter may be shortened in order to at least halve the number of multiplications.

In the following, the setup of the first mixer 704 and of the second mixer 706 are described in more detail, corresponding to the blocks fs_4_mixer_1 and fs_4_mixer_2 illustrated in FIG. 7. In principle it may be noted that a mixer converts a signal up or down in the spectral range by a certain frequency. The shift is here always related to the sampling frequency. An $f_s/4$ mixer, for example, shifts an input signal by exactly 25% of the sampling frequency and outputs this signal shifted in the frequency range as an output signal. A complex mixing, i.e. a mixing of a complex signal, is performed by a multiplication with a complex rotary term, which is:

$$dt[n] = \exp[i*2*\Pi*\Delta f/f_s * n] \text{ wherein } i=\text{sqrt}(-1).$$

With a frequency shift of $\Delta f = f_s/4$, such an $f_s/4$ mixer is reduced to a simple multiplier using the vector [1; i; −1; −i]. This was already illustrated as an example in FIG. 5. It may thus be said that the first, fifth, ninth, . . . input value is always multiplied by 1, while the second, sixth, tenth, . . . input value is always multiplied by i. The third, seventh, eleventh, . . . input value is then always multiplied by −1 and the fourth, eighth, twelfth, . . . input value is always multiplied by −i. Such a multiplication results in a positive frequency shift.

Figure 10:
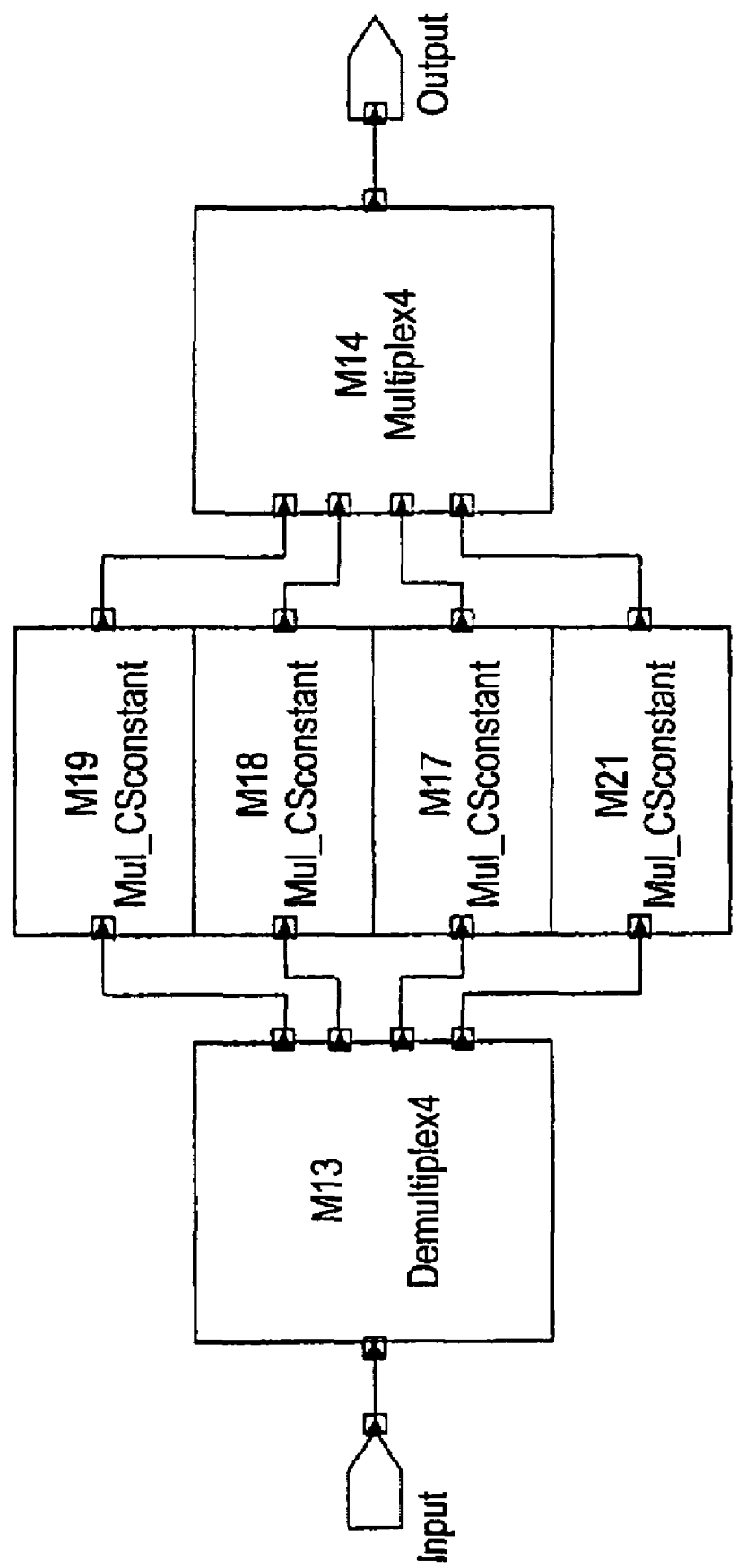
FIG. 10 shows a block diagram representing a detailed illustration of a block of FIG. 7.

As it was indicated above, such an $f_s/4$ mixing may be realized by four simple operations. Similar to a polyphase filter, such a mixer block, as it is illustrated in FIG. 7 as a first mixer 704 and a second mixer 708, may internally operate at a quarter of the output data rate. A mixer implemented in such a way is illustrated in FIG. 10. Such a mixer thus includes a mixer input, indicated as input, a one-to-four demultiplexer M13, a first multiplication element M19, a second multiplication element M18, a third multiplication element M17, a fourth multiplication element M21, a four-to-one multiplexer M14 and an output designated by output in FIG. 10.

The one-to-four demultiplexer M13 includes an input connected to input. Further, the one-to-four demultiplexer includes four outputs. The multiplication elements M19, M18, M17 and M21 respectively include one input and one output. One input each of one of the multiplication elements is connected to another output of the one-to-four demultiplexer M13. The four-to-one multiplexer M14 includes four inputs, wherein respectively one of the inputs of the four-to-one multiplexer M14 is connected to another output of one of the multiplication elements. Further the output of the four-to-one multiplexer M14 is connected to output.

If such a mixer illustrated in FIG. 10 receives a signal at its input, this signal is divided into block of four continuous signal values each, wherein one signal value each is allocated to another one of the multiplication elements M19, M18, M17 and M21. In those multiplication elements a multiplication explained in more detailed below takes place, wherein the result of the multiplication is supplied to the four-to-one multiplexer M14 via the outputs of the multiplication elements, generating a serial data stream from the supplied values and outputting the same via the output.

The values supplied to the mixer via its input are preferably complex data values, wherein to each of the multiplication elements M19, M18, M17 and M21 a complex data value is supplied through the one-to-four demultiplexer M13. For the multiplication, in each of the multiplication elements, subsequently a multiplication with a multiplication factor is performed, wherein the multiplication factor, for example, corresponds to the above-mentioned vector [1; i; −1; −i]. If, for example, in the first multiplication element M19 a multiplication with the first coefficient of the above-mentioned vector is performed (i.e. with a coefficient of 1) this means that directly at the output of the first multiplication element M19 the value applied at the input of the first multiplication element is output. If, for example, at the second multiplication element M18 a multiplication with the second coefficient (i.e. with i) is performed, this means that at the output of the second multiplication element M18 a value is applied corresponding to the following context:

output=−imag (input)+1*real (input), wherein imag (input) designates the imaginary part of the input value and real (input) designates the real part of the input value.

If, for example, in the third multiplication element a multiplication with the third coefficient of the above-mentioned vector (i.e. with −1) is performed, this means that at the output of the third multiplication element M17 a value is applied which assumes the following context with regard to the value applied to the input:

output=−real (input)−i*imag (input).

If further in the fourth multiplication element M21 a multiplication using the fourth coefficient (i.e. using −1) as a multiplication factor is performed, this means that at the output of the fourth multiplication element M21 a value is output which, considering the value applied at the input of the fourth multiplication element, is in the following context:

output=imag (input)−i*real (input).

Depending on the default of the parameter value fs_shift_1 illustrated in FIG. 7, which is supplied to the first mixer, or the second parameter set 712 with the parameter value fs_shift_2 which is supplied to the second mixer 708, a special vector is selected indicating the individual constants. For the case that, for example, fs_shift_x (with x=1 or 2) is selected to be −1, i.e. that a negative frequency shift is to be performed, a vector is to be selected comprising the following coefficient sequence: [1, −i, −1, i].

For the case that the parameter fs_shift_x is selected to be 0, i.e. that no frequency shift is to take place in the mixer, a coefficient vector with a coefficient sequence of [1, 1, 1, 1] is to be selected, while for the case that the parameter fs shift x is selected to be 1 (i.e. that a positive frequency shift is to take place), a vector with a coefficient sequence of [1, i, −1, −i] is to be selected. From the above explanations it results that the first parameter set 710 and the second parameter set 712 may be selected different from each other, depending on which of the different target frequencies is to be achieved.

Figure 11A:
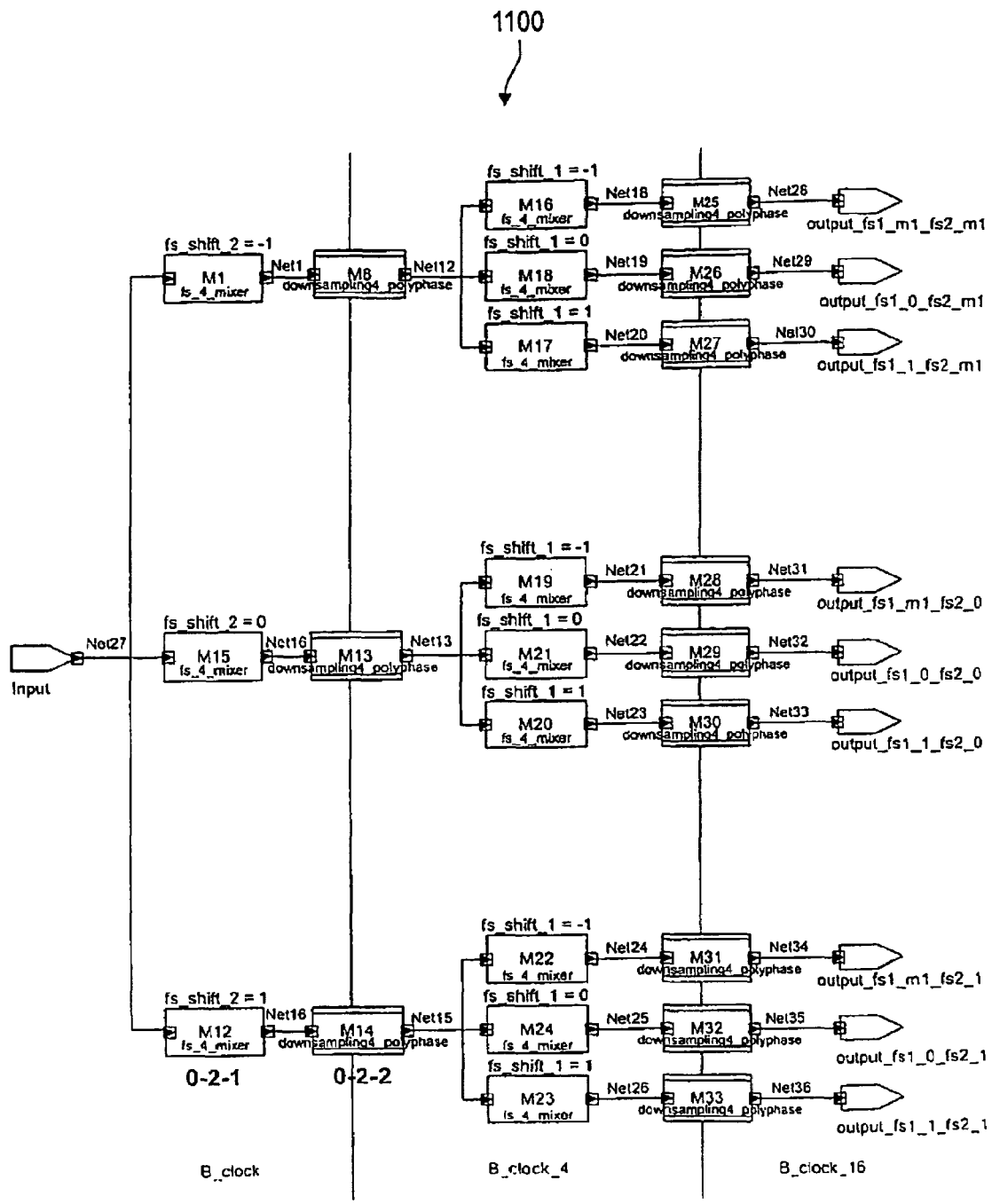
FIG. 11A shows a block diagram representing an embodiment of a mixer when using the mixer as a down-mixer (down-converter)

In the following, the downsampling is explained in more detail as it takes place, for example, in the frequency conversion in the receiver from a high current frequency to a low target frequency. Regarding this, FIG. 11A shows a block diagram of a mixer stage, as it may, for example, be used in a receiver. The mixer stage 1100 includes an input, a first mixer M1, a second mixer M15 and a third mixer M12, which are arranged in parallel in a first mixer level 0-2-1. Further, the mixer 1100 includes a first downsampling polyphase filter M8, a second downsampling polyphase filter M13, a third downsampling polyphase filter M14, a fourth mixer M16, a fifth mixer M18, a sixth mixer M17, a seventh mixer M19, an eighth mixer M21, a ninth mixer M20, a tenth mixer M22, an eleventh mixer M24 and a twelfth mixer M23. Additionally, the mixer 1100 further includes a fourth downsampling polyphase filter M25, a fifth downsampling polyphase filter M26, a sixth downsampling polyphase filter M27, a seventh downsampling polyphase filter M28, an eighth downsampling polyphase filter M29, a ninth downsampling polyphase filter M30, a tenth downsampling polyphase filter M31, an eleventh downsampling polyphase filter M32 and a twelfth downsampling polyphase filter M33.

Further, the mixer 1100 includes a first output output_fs1_m1_fs2_m1, a second output output_fs1_0_fs2_m1, a third output output_fs1_1_fs2_m1, a fourth output output_fs1_m1_fs2_0, a fifth output output_fs1_0_fs2_0, a sixth output output_fs1_1_fs2_0, a seventh output output_fs1_m1_fs2_1, an eighth output output_fs1_0_fs2_1, a ninth output output_fs1_1fs2_1.

All components of the described mixer 1100 (except for the input and the outputs output_ . . . ) respectively include one input and one output. The input of the first mixer M1, the second mixer M15 and the third mixer M12 are connected to the input of the mixer 1100 via the signal Net27. The output of the first mixer M1 is connected to the input of the first downsampling polyphase filter M8 via the signal Net1. The output of the first polyphase filter M8 is connected to the inputs of the fourth mixer M16, the fifth mixer M18 and the sixth mixer M17 via the signal Net12. The output of the fourth mixer M16 is connected to the input of the fourth downsampling polyphase filter M25 via the signal Net18, while the output of the fourth downsampling polyphase filter M25 is connected to the first output of the mixer 1100 via the signal Net28. The output of the fifth mixer M18 is connected to the input of the fifth downsampling polyphase filter M26 via the signal Net19, while the output of the fifth downsampling polyphase filter M26 is connected to the second output of the mixer 1100 via the signal Net29. The output of the sixth mixer M17 is connected to the input of the sixth downsampling polyphase filter M27 via the signal Net20, while the output of the sixth downsampling polyphase filter M27 is connected to the third output of the mixer 1100 via the signal Net30.

The output of the second mixer is connected to the input of the second downsampling polyphase filter M13 via the signal Net16. The output of the second downsampling polyphase filter M13 is connected to the inputs of the seventh mixer M19, the eighth mixer M21 and the ninth mixer M20 via the signal Net13. The output of the seventh mixer M19 is connected to the input of the seventh downsampling polyphase filter M28 via the signal Net21, while the output of the seventh downsampling polyphase filter M28 is connected to the fourth output via the signal Net31. The output of the eighth mixer M21 is connected to the input of the eighth downsampling polyphase filter M29 via the signal Net22, while the output of the eighth downsampling polyphase filter M29 is connected to the fifth output via the signal Net32. The output of the ninth mixer M20 is connected to the input of the ninth downsampling polyphase filter M30 via the signal Net23, while the output of the ninth downsampling polyphase filter M30 is connected to the sixth output via the signal Net33.

The third mixer M12 is connected to the input of the third downsampling polyphase filter M14 via the signal Net16. The output of the third downsampling polyphase filter M14 is connected to the inputs of the tenth mixer M22, the eleventh mixer M24 and the twelfth mixer M23 via the signal Net15. The output of the tenth mixer M22 is connected to the tenth downsampling polyphase filter M31 via the signal Net24, while the output of the tenth downsampling polyphase filter M31 is connected to the seventh output via the signal Net34. The output of the eleventh mixer M24 is connected to the input of the eleventh downsampling polyphase filter M32 via the signal Net25, while the output of the eleventh downsampling polyphase filter M32 is connected to the eighth output via the signal Net35. The output of the twelfth mixer M23 is connected to the input of the twelfth downsampling polyphase filter M33 via the signal Net26, while the output of the twelfth downsampling polyphase filter M33 is connected to the ninth output via the signal Net36.

Further, the outputs of the mixer 1100 are connected to the following components:

output_fs1_m1_fs2_m1 to the output of the fourth downsampling polyphase filter M25 output_fs1_0_fs2_m1 to the output of the fifth downsampling polyphase filter M26 output_fs1_1_fs2_m1 to the output of the sixth downsampling polyphase filter M27 output_fs1_m1_fs2_0 to the output of the seventh downsampling polyphase filter M28 output_fs1_0_fs2_0 to the output of the eighth downsampling polyphase filter M29 output_fs1_1_fs2_0 to the output of the ninth downsampling polyphase filter M30 output_fs1_m1_fs2_1 to the output of the tenth downsampling polyphase filter M31 output_fs1_0_fs2_1 to the output of the eleventh downsampling polyphase filter M32 output_fs1_1_fs2_1 to the output of the twelfth downsampling polyphase filter M33.

Analog to the mixer illustrated in FIG. 7, in the mixer 1100 illustrated in FIG. 11A also three different clock frequencies are used. First, the signal received at the input is based on a sampling frequency of B_Clock, wherein the first mixer M1, the second mixer M15 and the third mixer M12 operate using the sampling frequency B_Clock. In the following, in level 0-2-2, i.e. through the first downsampling polyphase filter M8, the second downsampling polyphase filter M13 and the third downsampling polyphase filter M14 a sampling rate reduction to a new sampling rate of B_Clock_4 takes place, which corresponds to a quarter of the sampling rate B_Clock. This means that the fourth to twelfth mixer operates with a sampling rate of B_Clock_4. In the following, by the fourth to twelfth downsampling polyphase filter a further sampling rate reduction to a new sampling rate of B_Clock_16 is performed, i.e. again a quartering of the sampling rate used in the fourth to twelfth mixer, which corresponds to one sixteenth of the sampling frequency of the signal applied to the input.

By the mixer structure 1100 illustrated in FIG. 11A, thus from the signal received at the input of the mixer 1100 simultaneously nine frequency sub-bands may be extracted. To this end it is necessary that the three mixers of level 0-2-1 are respectively set to a different mixing performance, that, for example, the first mixer M1 is set to a downconversion (downward mixing), the second mixer M15 to a neutral frequency conversion (i.e. no frequency shift) and the third mixer M12 to an upconversion (upward mixing). Further, also those mixer operating with the sampling rate B_Clock_4 (i.e. in particular the fourth to twelfth mixer) should be grouped into three mixers, respectively, wherein each mixer group is respectively connected downstream to one of the downsampling polyphase filters of the structure level 0-2-2. Each of the three mixers of a mixer group (i.e. for example the fourth, fifth and sixth mixers) should again be set different from each other so that, for example, the fourth mixer may again perform a downconversion, the fifth mixer no frequency conversion and the sixth mixer an upconversion. For the group of the seventh to ninth mixer and the group of the tenth to twelfth mixer the same holds true.

By such a cascaded and also parallel-connected mixer arrangement, thus the nine frequency bands may be extracted simultaneously from the signal applied at the input of the mixer 1100, as it is, for example, illustrated in FIG. 2. An advantage of such a parallel and cascaded arrangement is in particular that, on the one hand, by a structure easy to be implemented regarding numerics or circuit engineering a plurality of frequency sub-bands may simultaneously be resolved or received, respectively.

Figure 11B:
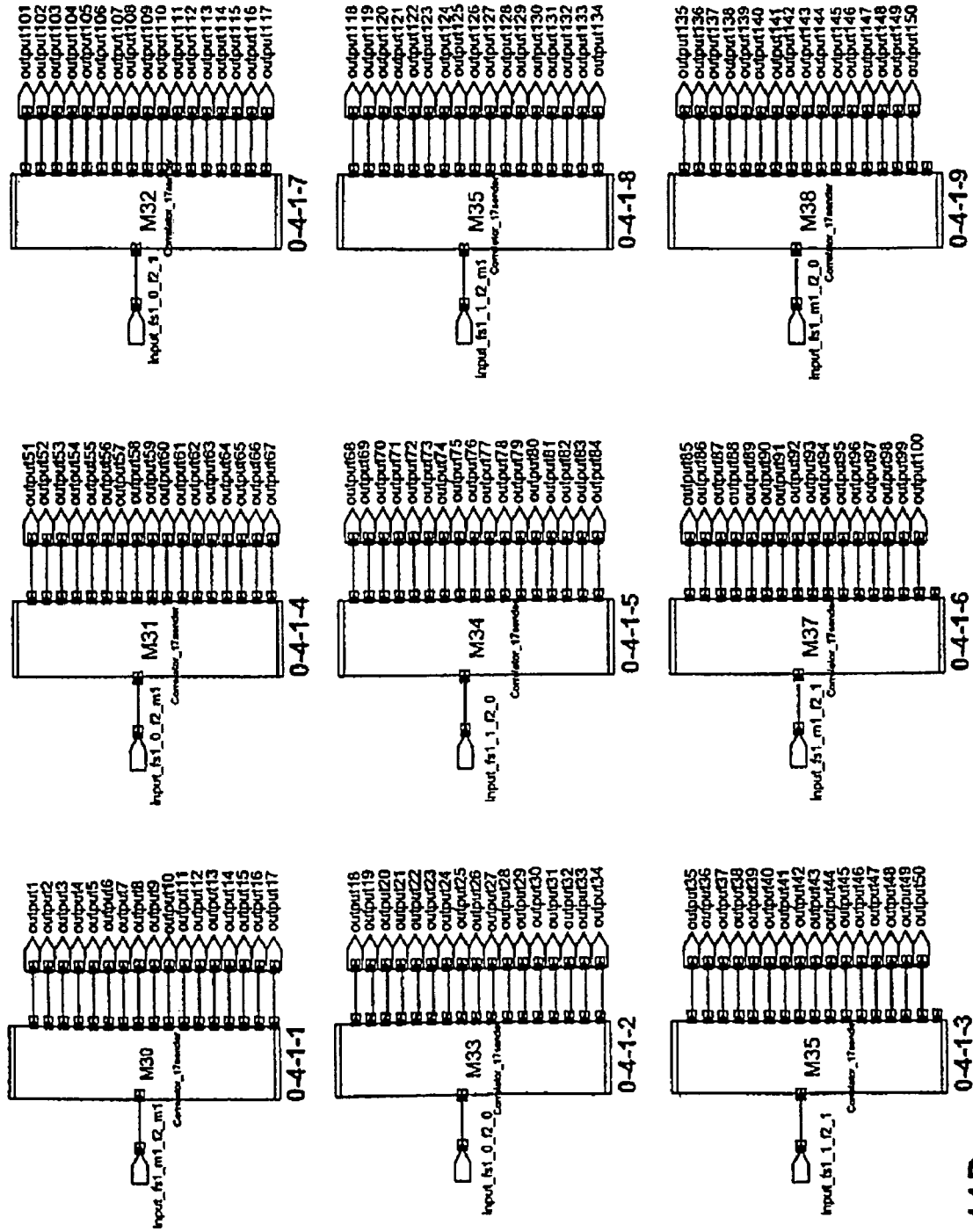
FIG. 11B shows a block diagram of a possible use of the outputs of the mixer shown in FIG. 11A using several correlators.

If now the individual frequency sub-bands, as they are illustrated in FIG. 11A as output signals, are to be provided with data, then on the individual frequency bands also several signals of different bands may be transmitted if the same are suitably correlated with each other. Here, FIG. 11B shows 9 correlators 0-4-1-1 to 0-4-1-9, representing the corresponding output signals of the mixer 1100 illustrated in FIG. 11A. Here, the corresponding output signals output_fs1_m1_fs2_m1 to output_fs1_1_fs2_1 are to be regarded as input signals input_fs1_m1_fs2_m1 to input_fs1_m1_fs_0. Each of the correlators 0-4-1-1 to 0-4-1-9 has one input and 17 outputs, wherein each of the outputs outputs an output signal output 1 to output 150 which is different from the other output signals. By such a setup, for example, 150 reference sequences may be distributed by 150 transmitters to the nine available frequency bands. A distribution of the individual reference sequences of the transmitters on one frequency band may in this case be performed by a correlation, wherein the obtained 150 correlation signals may later be used, for example, to coarsely determine the positions of 150 tracking bursts.

If only one frequency band existed, in which the 150 transmitters are located, 150 different reference sequences would be required for a possibility of distinguishing the individual transmitters. As the transmitters are distributed to 9 different frequency bands, theoretically only $$\left\lceil \frac{150}{9} \right\rceil = 17$$

sequences would be required, wherein 6 frequency bands respectively include 17 transmitters and 3 frequency bands (occupied by the correlators 0-4-1-3, 0-4-1-6 and 0-4-1-9) only respectively include 16 transmitters.

Assuming that the frequency bands have the same reference sequences for their 17 or 16 transmitters, respectively, in a simulation of such a transmission scenario the following problem occurs:

Two acquisition bursts were sent without mutually overlapping and without noise, wherein the two acquisition bursts were located in two different frequency bands but had the same reference sequences. With a particular selection of the two frequency bands, in the correlation with a sequence erroneously also peaks of the second burst sent were detected. These are exactly those frequency bands wherein one of the two rotation parameters fs shift_1 or fs_shift_2 matches, as in those cases the image spectrum of a frequency band is not sufficiently suppressed in the areas of the other associated frequency bands.

Figure 11C:
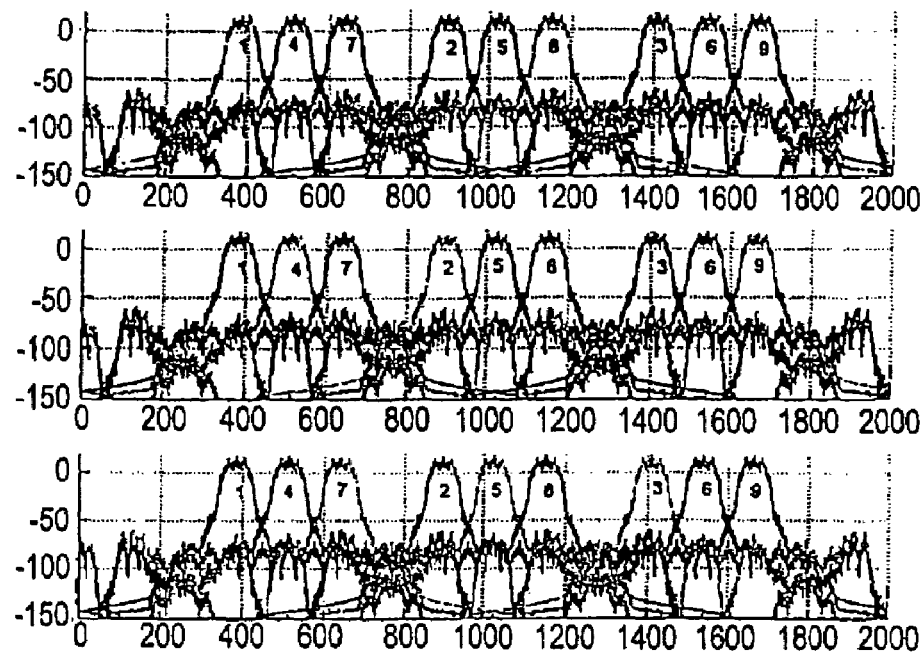
FIG. 11C shows a diagram of a possible occupation of frequencies in the use of the correlators illustrated in FIG. 11B.
Figure 11D:
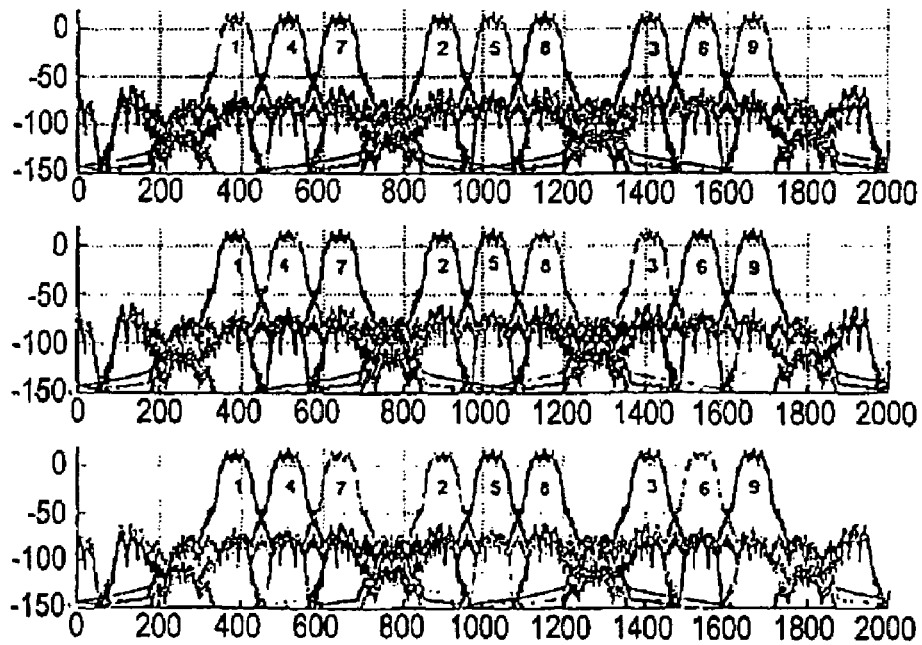
FIG. 11D shows a further diagram of a possible occupation of frequencies in the use of the correlators illustrated in FIG. 11B.

There are two possibilities to respectively merge three frequency bands having no common rotation parameter and for which thus the same sequences may be used without a false detection occurring (see FIG. 11C and FIG. 11D).

I.e., instead of 17 sequences 150/3=50 sequences are required.

The same sequences may be given to the following sequence triples:
1  (fs_shift_1=−1, fs_shift_2=−1), 6 (fs_shift_1=0, fs_shift_2=1), 8 (fs_shift_1=1, fs_shift_2=0) (see FIG. 11C topmost sub-diagram) or
2  (fs_shift_1=−1, fs_shift_2=0), 4 (fs_shift_1=fs_shift_1=0, fs_shift_2=−1), 9 (fs_shift_1=1, fs_shift_2=1) (see FIG. 11C middle sub-diagram) or
3  (fs_shift_1=−1, fs_shift_2=1), 5 (fs_shift_1=0, fs_shift_2=0), 7 (fs_shift_1=−1, fs_shift 2=−1) (see FIG. 11C bottommost sub-diagram)

or alternatively the same sequences may be given to the following frequency triples:
1(fs_shift_1=−1, fs_shift_2=−1), 5 (fs_shift_1=0, fs_shift_2=0), 9 fs_shift_1=1, fs_shift_2=1) (see FIG. 11D topmost sub-diagram) or
3(fs_shift 1=−1, fs_shift_2=1), 4 (fs_shift_1=0, fs_shift_2=−1), 8 (fs_shift_1=1, fs_shift_2=0) (see FIG. 11D middle sub-diagram) or
2(fs_shift_1=−1, fs_shift_2=0), 6 (fs_shift_1 0, fs_shift_2=1), 7 (fs_shift_1=−1, fs_shift_2=−1) (see FIG. 11D bottommost sub-diagram).

The two FIGS. 11C and 11D this way show two possibilities to respectively occupy three frequencies with the same sequences. In the correlators of FIG. 11B the second possibility was selected, so that the same correlation sequences are used in blocks 0-4-1-1 to 0-4-1-3 or in blocks 0-4-1-4 to 0-4-1-6, or in the blocks 0-4-1-7 to 0-4-1-9, respectively. With the exception of the input signals in the different correlation sequences, the setup of blocks 0-4-1-1 to 0-4-1-9 is identical. As the correlation is performed after the matched filter, the correlation sequences in the binary case only have the coefficients of 1 and −1. For the quaternary case, the coefficients are 1+j, −1+j, 1−j and −1−j. In both cases, the correlation sequences thus have to be in the sampling clock B_clock_48.

FIG. 12 shows a tabular illustration of the word width, data rate and data type of the signals illustrated in FIG. 11A, wherein it is to be noted that the word width of the corresponding signals may be defined depending on the used hardware components (tbd=to be defined). For the signal values of all signals, a complex data type is assumed.

First, a signal received from the mixer 1100 with a sampling clock B_clock is correspondingly down-converted by a quarter of the sampling frequency $f_s$, is not frequency converted, or is up-converted by a quarter of the sampling frequency $f_s$, using the parameter fs_shift_2 (i.e. with the parameter values fs_shift_2=−1, 0, 1), whereby three different signals are obtained. A more accurate definition of the parameter fs_shift_2 was discussed above. From the signal Net1 thus, as shown in the block diagram of FIG. 11A, the input signal Net27 is mixed with fs_shift_2=−1, the signal Net 17 is mixed with fs_shift_2=0 and the signal Net16 is mixed with fs_shift_2=1. Those three signals are then low-pass-filtered separately and downsampled, whereby three signals having a sample clock B_clock_4 are obtained.

Subsequently, those signals are each frequency-converted again using the parameter fs_shift_1 (i.e. the parameter values fs_shift_1=−1, 0, 1), wherein now the offset of the converted frequency corresponds to a quarter of the new sampling frequency (in the positive and negative direction) or is equal to 0. The input signals Net12, Net13 and Net15 are here mixed according to the table in FIG. 13 with the parameter fs_shift_1 in order to obtain the output signals Net18, Net19, Net20, Net21, Net22, Net23, Net24, Net25 and Net26. Finally, the nine resulting signals are low-pass filtered and downsampled and thus fed out at a sample clock of B_clock_16 via the first to ninth output.

In the following, again briefly the functioning of the mixers is explained, taking the mixers in level 0-2-1 and the downsampling polyphase filters as an example, using the downsampling polyphase filters of level 0-2-2 illustrated in FIG. 11A. The mixers in level 0-2-1 cancel out the shifting of the respectively applied signal by exactly 25% of its sampling frequency that took place in the transmitter. The complex mixing is again performed by a multiplication with a complex rotary term, which is:

$$dt[n]=\exp[j*2*\Pi*\Delta f/f_s*n) \text{ wherein } j=\text{sqrt}(-1)$$

With a mixer $\Delta f = -f_s/4$ this vector is reduced to [1; −j; −1; j]. This means that the first, fifth, ninth, . . . input values are always multiplied by −1, the second, sixth, tenth, . . . inputs values are always multiplied by −j, the third, seventh, eleventh, . . . input values are always multiplied by −1 and the fourth, eighth, twelfth, . . . input values are always multiplied by j. As it may be seen from the above description, this $-f_s/4$ mixing may be realized by four simple operations. Similar to a polyphase filter, this block may operate internally at a quarter of the output data rate. The setup and the function of such an $f_s/4$ mixer has already been described in more detail in FIG. 10 and in the description corresponding to the same. Such a mixer described there may also be used for a mixing in the receiver when the parameters fs_shift_1 and fs_shift_2 and the conversion of the sampling rate are selected suitably.

In the following paragraph, the concrete conversion of the downsampling polyphase filters in level 0-2-2 illustrated in FIG. 11A is explained in more detail. With these downsampling polyphase filters in level 0-2-2, first a downsmapling of the signal to clock B_clock_4 and after a second $-f_s/4$ mixing a downsampling to clock B_clock_16 is achieved. With the downsampling operations by the factor 4 present in this embodiment, the respectively applied signal is filtered with a low pass in order to suppress the occurring image spectrums and then only pass on every fourth sample. Basically, the setup of a downsampling polyphase filter corresponds to the setup of a polyphase filter illustrated in FIG. 8, in which an upsampling is performed; here, some details are to be explained in more detail. For this purpose, in FIG. 14 a block diagram of an exemplary structure of a downsampling polyphase filter is illustrated, as it may be used in level 0-2-2 illustrated in FIG. 11A.

Figure 14:
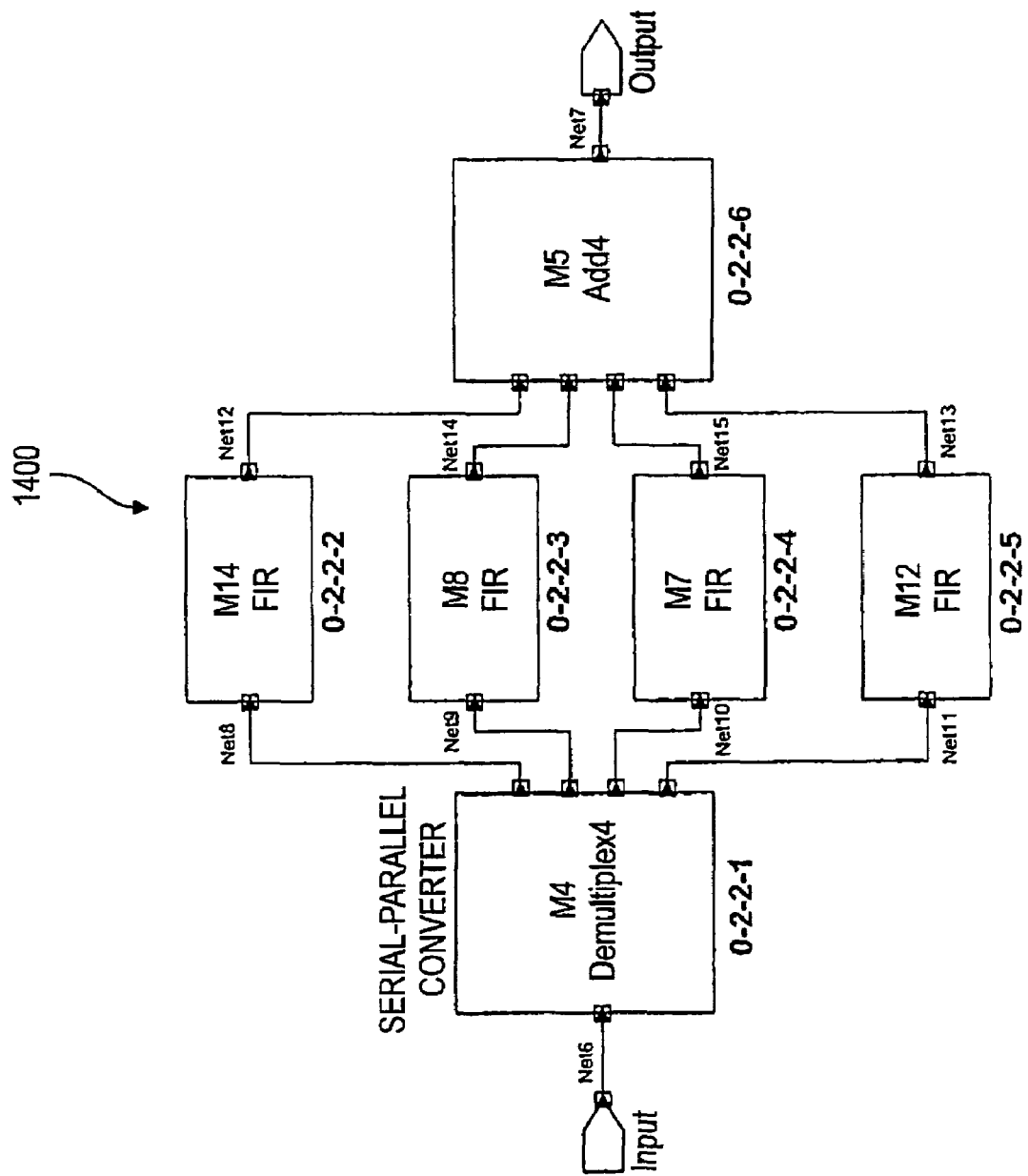
FIG. 14 shows a block diagram representing a detailed structure of a block illustrated in FIG. 11A.

FIG. 14 thus shows a downsampling polyphase filter 1400 comprising an input, a one-to-four demultiplexer 0-2-2-1 (serial parallel converter), a first FIR filter 0-2-2-2, a second FIR filter 0-2-2-3, a third FIR filter 0-2-2-4, a fourth FIR filter 0-2-2-5, an adder 0-2-2-6 and an output. Each of the FIR filters 0-2-2-2 to 0-2-2-5 respectively includes one input and one output. An input of the one-to-four demultiplexer 0-2-2-1 is connected to the input of the downsampling polyphase filter 1400 via the signal Net6. A first output of the demultiplexer M4 is connected to the input of the first FIR filter M14 via the signal Net8. A second output of the demultiplexer M4 is connected to the second FIR filter M8 via the signal Net9. A third output of the demultiplexer M4 is connected to the third FIR filter M7 via the signal Net10 and a fourth output of the demultiplexer M4 is connected to the input of the fourth FIR filter M12 via the signal Net11. Further, a first input of the adder MS is connected to the output of the first FIR filter M14 via the signal Net12, a second input of the adder MS is connected to the second FIR filter M8 via the signal Net14, a third input of the adder MS is connected to the output of the third FIR filter M7 and a fourth input of the adder MS is connected to the output of the fourth FIR filter M12 via the signal Net13. Additionally, an output of the adder M5 is connected to the output of the downsampling polyphase filter 1400 via the signal Net7.

As it may be seen from FIG. 14, a low-pass filter required in level 0-2-2 may be realized with the help of a polyphase approach, as an FIR filter having the length L may be divided into R sub-filters of the length L/R, wherein L indicates the FIR filter length and R indicates the upsampling factor of a signal. To this end, the signal supplied to the downsampling polyphase filter 1400 via its input is divided into R=4 parallel signal streams in the demultiplexer M4, and thus the applied sample clock is quartered (i.e. for example brought from a sample clock of B_clock to B_clock_4 or from B_clock_r to B_clock_16, respectively). The individual signal streams (i.e. the signals Net8-Net11) are then respectively filtered using an FIR filter of the length L/4 and the results are transmitted to the adder M5 via the signals Net12-Net15. In the adder M5 a summation of the signal values of the signals Net12-Net15 takes place.

A word width, a data rate and a data type of the signals illustrated in FIG. 14 may be taken from the tabular illustration of FIG. 15. Here, it is to be noted that a word width depends on the used hardware components (in particular a word width of an analog/digital converter used at the front end of the receiver). For this reason it may be said, that the word width is still to be defined depending on the use of the hardware components (i.e. in the column "word width" the designation tbd is inserted). Regarding the data rate it may be said, that the downsampling polyphase filter illustrated in FIG. 14 operates inversely to the filter illustrated in FIG. 8, whereby the reduction of the sampling rate of the signal Net6 with regard to the sampling rates of the signals Net7-Net15 may be explained. With regard to the data type it is to be noted that each of the illustrated signals is to be regarded as a complex signal.

Regarding the selection of the filter coefficients for the individual filters (i.e. the first FIR filter M14, the second FIR filter M8, the third FIR filter M7 and the fourth FIR filter M12) reference is made to the implementations regarding the filter illustrated in FIG. 8, wherein in particular the filter coefficients may be selected according to the tabular illustration in FIG. 9. Further, the fourth FIR filter M12, for the above-mentioned reasons, may again be selected as a delay element with a delay of 5 samples (i.e. the fourth FIR filter M12 may be implemented such that only a shift of the received input value by five elements takes place). Further, the second FIR filter M8 may be shortened based on the axially symmetrical structure and the even filter length, in order to at least halve the number of multiplications.

In the next section, a further embodiment of the inventive approach of the reduction of the sampling rates (i.e. the down-conversion) is to be explained in more detail. To this end, as an example a sampling rate reduction by the rate factor 4 and a filtering using an FIR filter having six coefficients ($a_0, a_1, a_2, a_3, a_4$ and $a_5$) is selected. As an input sequence, the signal value sequence $x_9, x_8, x_7, x_6, x_5, x_4, x_3, x_2, x_1$ and $x_0$ is used, wherein $x_0$ is the first received signal or the first sample.

In FIG. 16, the temporal allocation of the input data x to the filter coefficients when using the FIR filter with six coefficients is illustrated. The filter output here, according to the FIR filter regulation, results in an output value $FIR\_out = a_0 * x_5 + a_1 * x_4 + a_2 * x_3 + a_3 * x_2 + a_2 + \ldots$. In the case of the assumed sampling rate reduction factor of R) 4, only the value pairs with a dark background in the tabular illustration of FIG. 16 are used after the sampling rate reduction, all others are discarded.

If the lines with a dark backgound are extracted, then another illustration of the linking of the input values and the filter coefficients may be shown. Such an illustration is given in FIG. 17. The two right columns, i.e. the columns in which the filter coefficients $a_0$-$a_5$ are entered, now contain the coefficients in a different arrangement. The typical structures with FIR filters result, which are implemented in a polyphase structure. Each of the individual polyphases ("SUB FIR filter") consists of the coefficients of the original filter. The allocation is here performed according to the following scheme:

polyphase "1": $a_{0+i*\text{rate factor}}$ polyphase "2": $a_{1+i*\text{rate factor}}$ polyphase "3": $a_{2+i*\text{rate factor}}$

. . .

polyphase "rate factor": $a_{(\text{rate factor}-1)+1*\text{rate factor}}$ wherein $i = 0, 1, \ldots$ In the above example, with a rate factor of R=4, this means the allocation of the filter coefficients $a_0$ and $a_4$ to polyphase 1, the filter coefficients $a_1$ and $a_5$ to polyphase 2, the filter coefficients $a_2$ and the value 0 to polyphase 3 and the filter coefficients $a_3$ and the value 0 to polyphase 4. Should the number of the coefficients of the FIR filter not be dividable by the integer rate factor, then the missing coefficients are replaced by the value 0, as it was performed with the polyphases 3 and 4.

Figure 18:
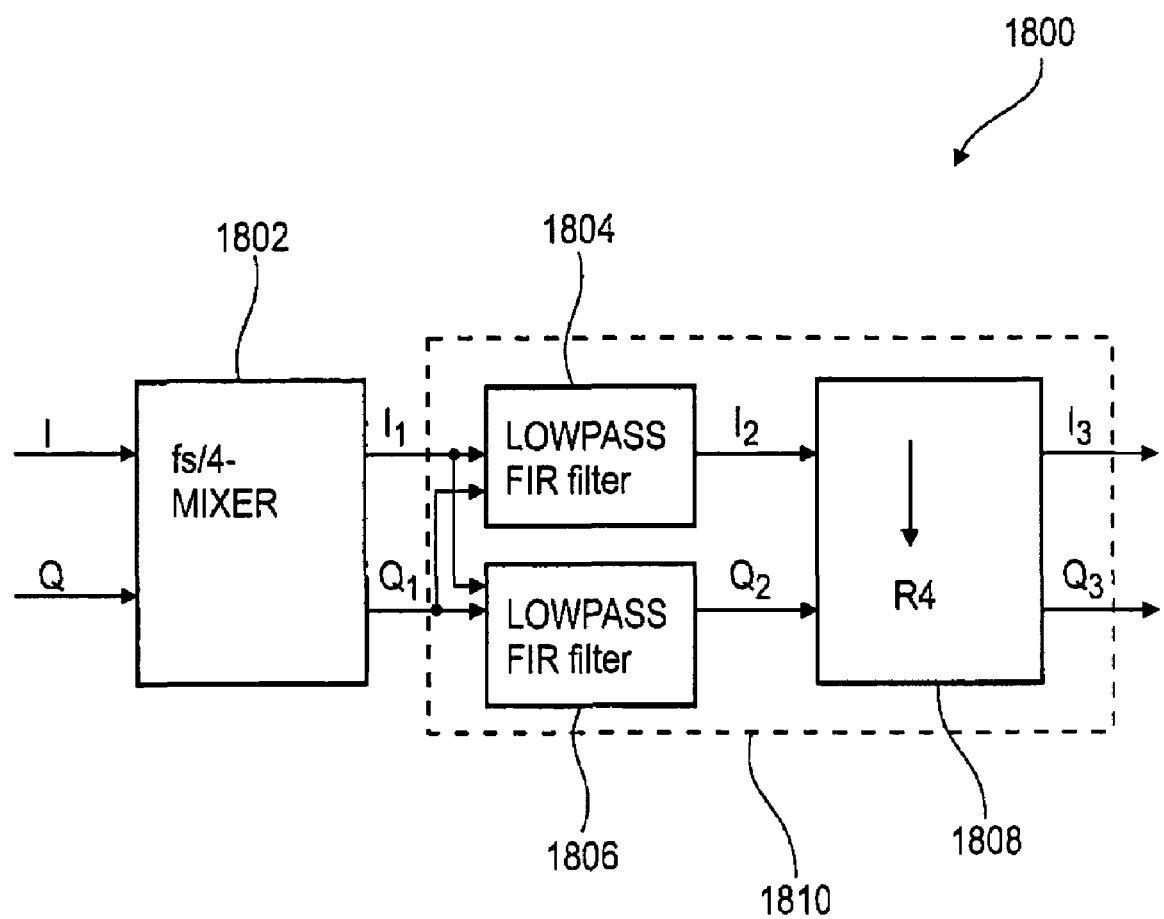
FIG. 18 is a block diagram of a further embodiment of the present invention.
Figure 24A:
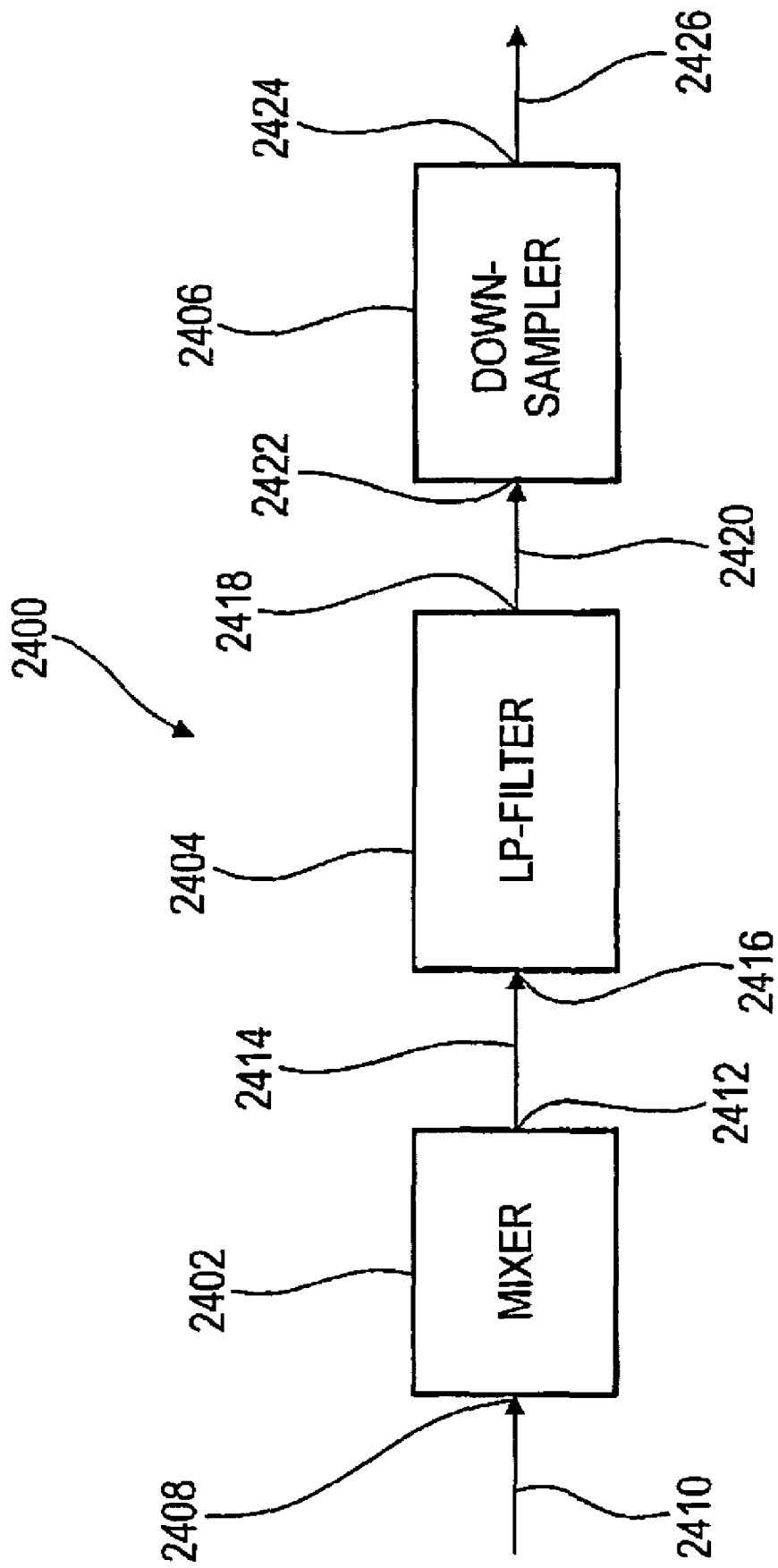
FIGS. 24A show a block diagram of conventional signal and 24B converters for an up- and down-conversion.
Figure 24B:
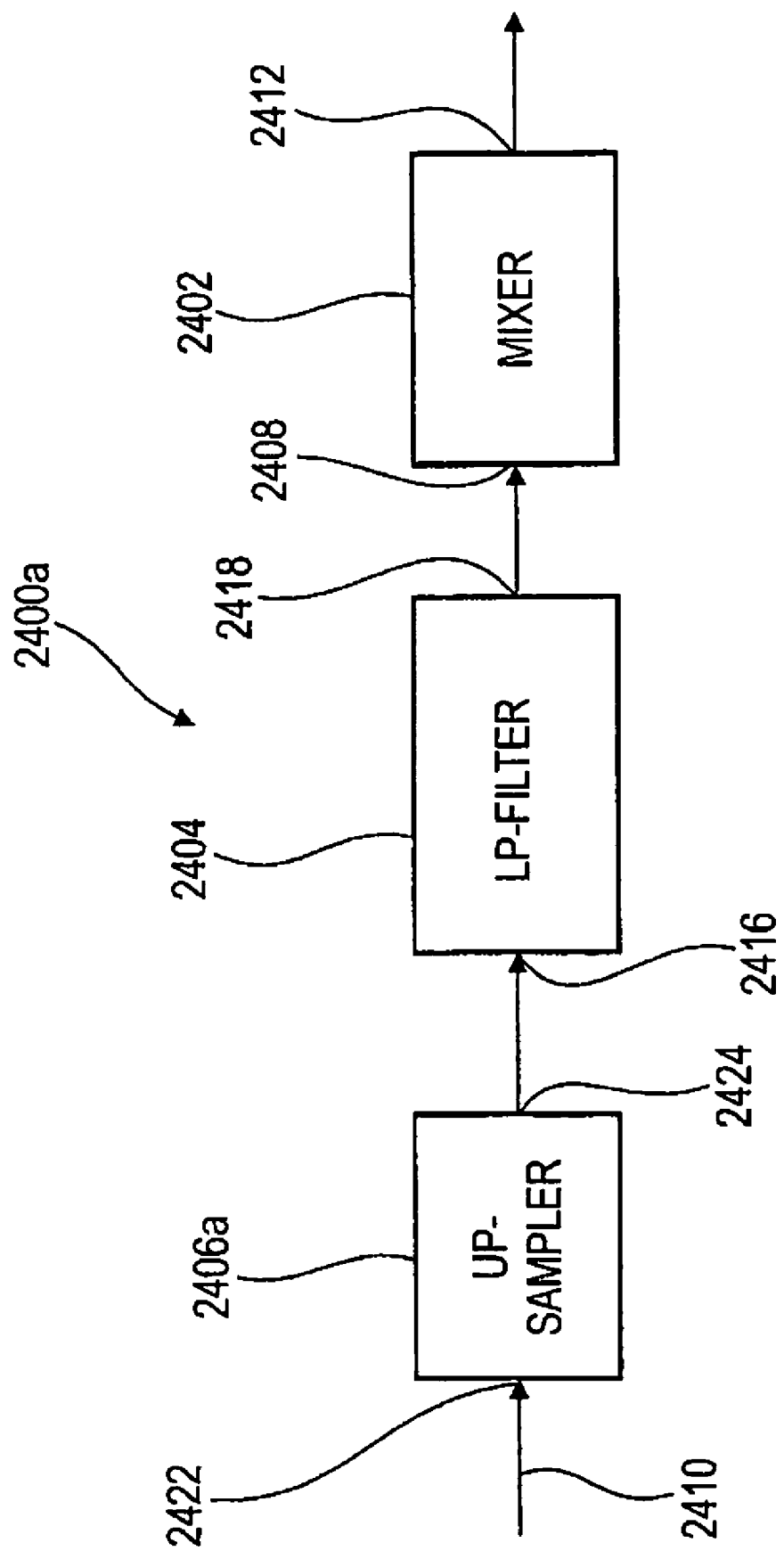

Such a polyphase filter structure may now effectively be used for a frequency shift by a quarter of the sampling frequency with a subsequent sampling rate reduction. FIG. 18 shows a block diagram of a mixer 1800, in which the principal functioning of the frequency shift of a complex signal with a subsequent sampling rate reduction by the factor R=4 is illustrated. The mixer 1800 includes an $f_s/4$ mixer 1802, a first low-pass filter 1804, a second low-pass filter 1806 and a sampling rate reduction unit 1808. The $f_s/4$ mixer 1802 includes a first input I for receiving an I component of a signal and a second input Q for receiving a Q component of a signal, wherein the Q component of the signal is orthogonal to the I component of the signal. Further, the $f_s/4$ mixer 1802 includes a first output for outputting an $I_1$ component of a mixed signal and a second output for outputting a $Q_1$ component of the mixed signal.

Further, the first low-pass filter 1804 comprises an input for receiving the $I_1$ component of the frequency-converted signal and an output for outputting an $I_2$ component of a low-pass-filtered frequency-converted signal. The second low-pass filter 1806 includes an input for receiving the $I_1$ component of the frequency-converted signal and an output for outputting a $Q_2$ component of a low-pass-filtered mixed signal. The sampling rate reduction unit 1808 includes a first input for receiving the $I_2$ component of the low-pass-filtered mixed signal and a second input for receiving the $Q_2$ component of the low-pass-filtered mixed signal. Further, the sampling rate reduction means 1808 includes a first output for outputting an $I_3$ component of a sampling-rate-reduced low-pass-filtered mixed signal and a second output for outputting a $Q_3$ component of a sampling-rate-reduced low-pass-filtered mixed signal.

The functioning of the mixer 1800 illustrated in FIG. 18 is described in more detail in the following. The following implementations here first relate to a polyphase filter realizing a functionality of block 1810 illustrated in FIG. 18. Here, by the polyphase filters to be realized, the functionality of the first low-pass filter 1804, the functionality of the second low-pass filter 1806 and the functionality of the sampling rate reduction means 1808 are to be provided. The two illustrated low-pass filters are here assumed to be identical.

If the values illustrated in FIG. 17 are used as (complex) input data x (=i+jq) for the mixer 1802 (i.e. the I component and the Q component), for example with a polyphase structure of the first low-pass filter 1804 an allocation of the real (i) and imaginary part values (q) of the input values illustrated in FIG. 17 according to the illustration in FIG. 19 results. The allocation of the real and imaginary part values i and q resulting from the input signal x to the frequency-converted signal with the components $I_1$ and $Q_1$ is done by the mixer 1802 which may perform a negation and/or exchange of real and imaginary part values of the input signal x to the frequency-converted signal $I_1$ and $Q_1$. It is further to be noted that the values illustrated in the table in FIG. 19 correspond to real part values, as they are listed in the tabular illustration in FIG. 4 for a positive frequency shift. The tabular illustration according to FIG. 19 thus represents the allocation of values to four different polyphases, if the first low-pass filter 1804 is implemented in a four-fold polyphase structure. The illustration in FIG. 19 thus shows how the real part with a polyphase structure of a signal shifted by $f_s/4$ may be calculated as an input signal. Here, the real or imaginary part values, respectively, weighted with the corresponding filter coefficients $a_0$ to $a_5$ of the individual polyphase part filters (polyphase 1 to polyphase 4) are summed up in order to obtain the filtered and downsampled output signal $I_3$.

If, analog to the above implementations, for the second low-pass filter 1806 also a polyphase structure is used, like the complex input data x illustrated in FIG. 17 with a real part i and an imaginary part q, then as a result an allocation of the real and imaginary parts of the individual samples x to the polyphases results according to the illustration in FIG. 20. Here it is shown that the values illustrated in FIG. 20 correspond to the real part values of the overview illustrated in FIG. 4 with a positive frequency shift. Further, the real or imaginary part values, respectively, weighted with the corresponding filter coefficients $a_0$ to $a_5$ of the individual polyphase sub-filters (polyphase 1 to polyphase 4) are summed up in order to obtain the filtered and downsampled output signal $Q_3$.

With a close view of the respective input data x of the filters, as they are obvious by the i and q values from the tables in FIGS. 19 and 20, it is obvious that at every point in time, i.e. at every time index n, the polyphases are "fed" only with i or with q data. Due to the independence of the individual polyphases, the same may be resorted. For a calculation of the real part and the imaginary part of the mixer 1800 illustrated in FIG. 18, then only the corresponding polyphase results have to be summed. By such an implementation, thus a low-pass filtering and a downsampling may be performed, by filtering the input values with the filter coefficients of the (low-pass) filter $a_0$ to $a_5$ and simultaneously performing the downsampling by the summation of the four polyphase results to form a final result.

According to the mixer 1800 illustrated in FIG. 18, thus by the use of two polyphase filters respectively including the functionality of the first low-pass filter and the sampler or the functionality of the second low-pass filter 1806 and the sampling rate converter 1808, a clear simplification of the circuit structure may be realized. Thus, for example, the $I_3$ component, as it is illustrated in FIG. 18, may be realized from the summation of the individual results of the individual polyphases according to the illustration in FIG. 19, and the $Q_3$ component of the mixer 1800 illustrated in FIG. 18 may be realized by a summation of the partial results of the individual polyphases according to the summation in FIG. 20.

For repeated reference, it is to be noted here, that the signs of the input data x come from the upstream mixer. In FIG. 18, the data stream, consisting of the $I_1$ and the $Q_1$ components would thus have to be used as an input signal x for the low-pass filters. This in particular relates to the signs of the polyphases illustrated in FIGS. 19 and 20, polyphase 2 (im), polyphase 3 (re), polyphase 3 (im) and polyphase 4 (re). If the mixer is not present, the signs are omitted, or another frequency shift is selected, respectively, the signs in lines polyphase 2 (im) and polyphase 4 (im), and polyphase 2 (re) and polyphase 4 (re) are exchanged. Those signs may be included in the corresponding polyphases themselves. This is in particular interesting when always one of the two frequency shifts is selected, i.e. when the corresponding coefficients are negated.

FIG. 21 shows such a negation of individual real part values i and imaginary part values q of the input signal values x, wherein simultaneously a reordering of the real and imaginary part values to individual polyphases of the different polyphase filter (i.e. the polyphase filter for the real part and the polyphase filter for the imaginary part) is performed. In the following, the polyphases of the FIR filter are designated by POLY_FIR_1, . . . , wherein the result of the first polyphase, i.e. of POLY_FIR_1 results as the sum of the input values weighted with the filter coefficients $a_0$ and $a_4$. For the second to fourth polyphase the above implementations also hold true. The outputs of the polyphase filters are designated by RE/IMAG_P_OUT_1 . . . 4. The inputs of the filters are represented by the real and imaginary part.

A general approach of the polyphase structure under consideration of an $f_s/4$ shift is shown in FIG. 22. Here again an allocation of the real and imaginary part values to the individual polyphases is illustrated. Further, the designation of the results of the individual polyphases by RE_P_OUT_1 . . . 4 and IM_P_OUT_1 . . . 4 is defined. On the basis of the results defined in FIG. 22 of the polyphase filters now three possibilities may regarded:

no frequency shift;

frequency shift in the positive direction; and frequency shift in the negative direction.

If no frequency shift is performed, a real part of the resulting (downsampled) signal which is, for example, the $I_3$ component of the mixer 1800 illustrated in FIG. 18, results by a summation of the results of the polyphases RE_P_OUT_1, RE_P_OUT_2, RE_P_OUT_3 and RE_P_OUT_4. Correspondingly, an imaginary part of the (downsampled) signal, for example corresponding to the $Q_3$ component of the mixer 1800 illustrated in FIG. 18, results by a summation of the results IM_P_OUT_1, IM_P_OUT_2, IM_P_OUT_3, IM_P_OUT_4.

If a frequency shift in the positive direction is selected, the real part (i.e. of the $I_3$ component) may be determined by a summation of the polyphase results RE_P_OUT_1, IM_P_OUT_2, −RE_P_OUT_3 and −IM_P_OUT_4, while the imaginary part (i.e. the $Q_3$ component) results from a summation of the polyphase results IM_P_OUT_1, −RE_P_OUT_2, −IM_P_OUT_3 and RE_P_OUT_4. If a frequency shift in the negative direction is desired, the real part may be determined by a summation of the polyphase results RE_P_OUT_1, −IM_P_OUT_2, −RE_P_OUT$_3$ and IM_P_OUT_4, whereas the imaginary part may be determined by a summation of the polyphase results IM_P_OUT_1, RE_P_OUT_2, −IM_P_OUT_3 and −RE_P_OUT_4.

An overview over the polyphase results to be summed for the realization of a frequency shift in the positive direction, a frequency shift in the negative direction and no frequency shift is illustrated in FIG. 23.

By this it may be seen that already by a polyphase filter structure having a corresponding negation and reordering possibility, a mixer may be realized offering all functionalities of the mixer 1800 illustrated in FIG. 18, in particular of frequency mixing, low-pass filtering and downsampling. This enables performing the negation and reordering as well as the weighting using filter coefficients for realizing the low-pass filtering in any order, which results in a further flexibilization and thus in a further improvement of the applicability of the mixer. Further, by this additional flexibilization also simplifications in the circuit design or in the numerical complexity may be achieved, as now no strict adherence to the order of the individual steps is necessary, but rather a more efficient implementation in terms of circuit engineering or numerics of the $f_s/4$ mixing is enabled.

Depending on the conditions, the inventive method for a spectral conversion of a signal may be implemented in hardware or in software. The implementation may be performed on a digital storage medium, in particular a floppy disc or a CD with electronically readable control signals which may cooperate with a programmable computer system so that the corresponding method is performed. In general, the invention thus also consists in a computer program product having a program code stored on a machine-readable carrier for performing the inventive method when the computer program product runs on a computer. In other words, the invention may thus be realized as a computer program having a program code for performing the method when the computer program runs on a computer.

An orthogonal transmission is to be realized in which the signals do not affect each other even in the presence of a dispersive (multipath) channel or a non-ideal symbol timing or a non-ideal frame synchronization. Based on these requirements, the OFDM method (OFDM=orthogonal frequency division multiplexing) is not applicable in this case.

Further, the generation of such signals should be possible with a structure of low complexity, in particular considering the number of required filter coefficients and considering the clock rate of the filters.

A (conventional) solution for such a task was illustrated in FIG. 25. If, for example, a triple FDM signal (FDM=frequency division multiplexing) is required, specific characteristics of a digital $f_s/4$ mixing may be used, wherein $f_s$ represents the sampling frequency. More details regarding the $f_s/4$ mixing may be taken from the above description. If three signals are to be multiplexed together, first an upsamling of each of the signals from the original sampling frequency $f_{s,1}$ to the new sampling frequency $f_{s,2}=4\times f_{s,1}$ may be required. For this purpose, three zeros are inserted after each sample into each of the three signals. Here it is assumed that the signal xplus[k] is mixed to a center frequency of $+f_{s,2}/4$ the signal xzero[k] to a center frequency of 0 and the signal xminus[k] to a center frequency of $-f_{s,2}/4$. Such an arrangement is illustrated in FIG. 25. After the zero insertion, a discarding of image frequencies of the original signal by a low-pass filter is performed. Downstream from this low-pass filter the $f_s/4$ mixer is arranged, mixing the signal into the desired center frequency (for example for the signal xzero[k]: no mixing). Finally, the three (upsampled, low-pass-filtered and mixed) signals are added. By this, the output signal y[m] results, whose sampling frequency corresponds to the fourfold sampling frequency of the original signal. By the present invention, in such a structure a simplification may be realized. Based on the insertion of three zeros after each valid sample in the upsampling unit, the low-pass filter may be separated into four phases of a polyphase structure. All of those filters (i.e. those phases of the polyphase structure), on average comprising a quarter of the length of the original low-pass filter, may be operated in parallel with a clock rate of the original sampling frequency $f_{s,1}$. The output signals of the individual phases of the polyphase structure are then multiplied with specific constants (1 or j, or −1 or −j) to obtain the $f_s/4$ mixer before the output signals obtained by the $f_s/4$ mixer are (time) multiplexed and added. Such a signal converter structure is illustrated in FIG. 1A. An examination of the structure in FIG. 1A and the application of simple rules for linear systems discloses that the position of the multipliers (having the multiplication factors 1, j, −1 or −j) and the polyphase filters may be exchanged. It was further found that at one point in time respectively-always one output of, for example, all three phase 0 filters is summed to the output signal y[m], and in the next point in time all three signals of the phase 1 filter are summed, then all three output signals of the phase 2 filter and finally all output values of the phase 3 filter are summed at one point in time. This leads to the fact that also the summation may be put before the polyphase filters so that a structure of a signal converter results as it is illustrated in FIG. 1B.

The structure illustrated in FIG. 1B offers the advantage that only four polyphase filters are required which correspond to one single low-pass filter instead of three low-pass filters regarding their complexity. Here, it is to be noted, that the multiplication with the factors 1, j, −1 and −j may be performed in a simple way by exchanging or by multiplexing and negating, respectively—an actual performing of a multiplication is thus not required.

With a simple upsample filter $f_s/4$-mixing summation unit, as it is, for example, illustrated in the FIGS. 1A and 1B above, a frequency multiplex of a maximum of three signals may be performed. If several such structures are cascade-connected, for example for the case that the output y[m] of the first stage becomes the input of the second stage, for example the signal xplus[m], a frequency multiplex scheme of a maximum of 3×3=9 signals may be generated. In this case, only 4×3=16 polyphase filters are required corresponding to four low-pass filters instead of 3×3+3=12 low-pass filters according to a conventional implementation. Obviously, also a random number (e.g. 3 or more) of such upsample filter $f_s/4$-mixer summation stages may be cascade-connected to increase the number of signals in a frequency multiplex scheme.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. A signal converter for converting a start signal into an end signal, comprising:
    a copier for copying the start signal to obtain a plurality of copied start signals, wherein a copied start signal may be fed into a processing branch as a branch signal;
    a first branch processor in the first processing branch for processing a first branch signal according to a first processing regulation to obtain a first processed branch signal;
    a second branch processor in a second processing branch for processing a second branch signal according to a second processing regulation to obtain a second processed branch signal,
    wherein the second processing regulation is different from the first processing regulation, and wherein the first processing regulation and the second processing regulation are implemented to cause a low-pass polyphase filtering of the copied start signals; and
    a selector for a sequential selection of the first processed branch signal and then of the second processed branch signal in order to obtain the end signal,
    wherein one of the branch processors is implemented to additionally perform processing operations, wherein an additional processing operation includes a complex left-hand rotary operation or a complex right-hand rotary operation,
    wherein the branch signal is a complex signal having a real part and an imaginary part, and wherein further the complex left-hand rotary operation or the complex right-hand rotary operation includes a real part/imaginary part exchange operation with a negation of the real part or the imaginary part; wherein the copier for copying is implemented to further determine a third and fourth copied start signal from the start signal,
    wherein each of the four copied start signals may be fed into one of four processing branches as a branch signal,
    wherein the signal converter further comprises a third branch processor in a third processing branch to process the third copied start signal according to a third processing regulation, to obtain a third processed branch signal, and wherein the signal converter comprises a fourth branch processor in a fourth processing branch, to process the fourth copied start signal according to a fourth processing regulation, to obtain a fourth processed branch signal,
    wherein the third and fourth processing regulation are implemented to cause a low-pass polyphase filtering, and
    wherein the selector is implemented, after the second processed branch signal, to select the third processed branch signal and then the fourth processed branch signal to obtain the end signal, whereby the end signal has a four-fold sampling rate as compared to the start signal;
    wherein the first branch processor is implemented to obtain the first branch signal from the copied start signal according to a first processing regulation, wherein the second branch processor is implemented to obtain the second branch signal from the copied start signal according to the second processing regulation and using a complex left-hand rotary operation, wherein the third branch processor is implemented to obtain the third branch signal from the copied start signal according to a third processing regulation and using a negation, and wherein the fourth branch processor is implemented to obtain the fourth branch signal from the copied start signal according to a fourth processing regulation and using a complex right-hand rotary operation.

2. The signal converter according to claim 1, further comprising:
    a further copier for copying a second start signal to obtain a plurality of copied second start signals;
    a branch adder in each processing branch, wherein the branch adder is implemented to add one of the plurality of copied second start signals or a signal derived from the plurality of copied second start signals to the copied start signal in the processing branch or a signal derived from the copied start signal, to obtain an addition signal, wherein the branch adder is further arranged to process the addition signal according to the processing regulation for the processing branch.

3. The signal converter according to claim 2, wherein the branch adder is further implemented to cause the signal derived from the copied second start signal to correspond to a copied second start signal right- or left-hand rotated in the plane of complex numbers.

4. The signal converter according to claim 3, wherein a first branch adder is implemented to provide a first signal derived from the copied second start signal, and wherein a second branch adder is implemented to provide a second signal derived from the second copied start signal, wherein the first signal derived from the copied start signal and the second signal derived from the copied start signal are different from each other.

5. The signal converter according to claim 2, further comprising:
    a third copier for copying a third start signal to obtain a plurality of copied third start signals, wherein each branch adder is implemented to add one of the plurality of copied third start signals or a signal derived from the copied third start signal to the copied start signal, the signal derived from the copied start signal, the copied second start signal, the signal derived from the copied second start signal or the addition signal in order to provide a further addition signal, wherein the branch adder is arranged to process the further addition signal according to the processing regulation for the branch.

6. The signal converter according to claim 2, wherein the branch adder is further implemented to cause the signal derived from the copied third start signal to correspond to a copied third start signal right- of left-hand rotated in the plane of complex numbers.

7. The signal converter according to claim 6, wherein the branch adder is implemented to perform a first complex rotary operation to obtain the signal derived from the copied second start signal from the copied second start signal, and to perform a second complex rotary operation to obtain the signal derived from the copied third start signal from the copied third start signal, wherein the first rotary operation is different from the second rotary operation.

8. The signal converter according to claim 1, further comprising:
- a further copier for copying a second start signal to obtain a plurality of copied second start signals, wherein a copied second start signal may be fed into a weighting path as a path signal;
- a first path weighter in a first weighting path for weighting a first path signal according to a first weighting regulation to obtain a first weighted path signal;
- a second path weighter in a second weighting path for weighting a second path signal according to a second weighting regulation to obtain a second weighted path signal, wherein the first weighting regulation is different from the second weighting regulation and the first and second weighting regulations are implemented to cause a low-pass polyphase filtering of the path signals;
- a further selector for a sequential selection of the first weighted path signal and then of the second weighted path signal to obtain a further end signal; and
- a summator for summing the end signal and the further end signal to provide an output signal.

9. The signal converter according to claim 8, wherein the path weighter is implemented to perform an additional weighting operation, wherein the additional weighting operation includes a negation, a complex left-hand rotary operation or a complex right-hand rotary operation.

10. The signal converter according to claim 8, wherein further copier for copying is implemented to further determine a third copied second start signal and a fourth copied second start signal from the second start signal,
- wherein each of the four copied second start signals may be fed as a path signal into one of four weighting paths, wherein the signal converter further comprises a third path weighter in a third weighting path to weight the third copied second start signal according to a third weighting regulation to obtain a third weighted path signal, and comprises a fourth path weighter in a fourth weighting path to weight the fourth copied second start signal according to a fourth weighting regulation to obtain a fourth weighted path signal,
- and wherein a further selector for selecting is implemented to select the third weighted path signal after the second weighted path signal and then the fourth weighted path signal to obtain the further end signal which, compared to the second start signal, comprises a four-fold sampling rate.

11. The signal converter according to claim 10, wherein the first path weighting is different from the first processing device and the second path weighter is different from the second processing device.

12. A method for converting a start signal into an end signal, comprising:
- copying the start signal to obtain a plurality of copied start signals, wherein a copied start signal may be fed into a processing branch as a branch signal;
- processing a first branch signal according to a first processing regulation in the first branch processor in the first processing branch to obtain a first processed branch signal;
- processing a second branch signal according to a second processing regulation in the second branch processor in a second processing branch to obtain a second processed branch signal, wherein the second processing regulation is different from the first processing regulation, and wherein the first processing regulation and the second processing regulation are implemented to cause a low-pass polyphase filtering of the copied start signals; and
- wherein the step of processing the first or second processing signal includes performing an additional processing operation, an additional processing operation including a complex left-hand rotary operation or a complex right-hand rotary operation,
- wherein the branch signal is a complex signal having a real part and an imaginary part, the complex left-hand rotary operation or the complex right-hand rotary operation further including a real part/imaginary part exchange operation with a negation of the real part or the imaginary part;
- copying the start signal to further determine a third and a fourth copied start signal from the start signal;
- wherein each of the four copied start signals may be fed into one of four processing branches as a branch signal;
- processing the third copied start signal according to a third processing regulation in a third branch processor in a third processing branch to obtain a third processed branch signal;
- processing the fourth copied start signal according to a fourth processing regulation in a fourth branch processor in a fourth processing branch to obtain a fourth processed branch signal;
- wherein the third and fourth processing regulation are selected to cause a low-pass polyphase filtering;
- sequentially selecting the first processed branch signal and then the second processed branch signal and then the third processed branch signal and then the fourth processed branch signal in a selector to obtain the end signal,
- whereby the end signal has a four-fold sampling rate as compared to the start signal;
- wherein the first branch signal is obtained from the copied start signal according to the first processing regulation,
- wherein the second branch signal is obtained from the copied start signal according to the second processing regulation and using a complex left-hand rotary operation,
- wherein the third branch signal is obtained from the copied start signal according to the third processing regulation and using a negation, and
- wherein the fourth branch signal is obtained from the copied start signal according to the fourth processing regulation and using a complex right-hand rotary operation.

13. A signal converter for converting a start signal into an end signal, comprising:
- a copier for copying the start signal to obtain a plurality of copied start signals, wherein a copied start signal may be fed into a processing branch as a branch signal;
- a first branch processor in the first processing branch for processing a first branch signal according to a first processing regulation to obtain a first processed branch signal;
- a second branch processor in a second processing branch for processing a second branch signal according to a second processing regulation to obtain a second processed branch signal,
- wherein the second processing regulation is different from the first processing regulation, and wherein the first processing regulation and the second processing regulation are implemented to cause a low-pass polyphase filtering of the copied start signals; and
- a selector for a sequential selection of the first processed branch signal and then of the second processed branch signal in order to obtain the end signal,
- wherein one of the branch processors is implemented to additionally perform processing operations, wherein an additional processing operation includes a complex left-hand rotary operation or a complex right-hand rotary operation, wherein the branch signal is a complex signal having a real part and an imaginary part, and wherein further the complex left-hand rotary operation or the complex right-hand rotary operation includes a real part/imaginary part exchange operation with a negation of the real part or the imaginary part; wherein the copier for copying is implemented to further determine a third and fourth copied start signal from the start signal, wherein each of the four copied start signals may be fed into one of four processing branches as a branch signal, wherein the signal converter further comprises a third branch processor in a third processing branch to process the third copied start signal according to a third processing regulation, to obtain a third processed branch signal, and wherein the signal converter comprises a fourth branch processor in a fourth processing branch, to process the fourth copied start signal according to a fourth processing regulation, to obtain a fourth processed branch signal, wherein the third and fourth processing regulation are implemented to cause a low-pass polyphase filtering, and wherein the selector is implemented, after the second processed branch signal, to select the third processed branch signal and then the fourth processed branch signal to obtain the end signal, whereby the end signal has a four-fold sampling rate as compared to the start signal; wherein the first branch processor is implemented to obtain the first branch signal from the copied start signal according to a first processing regulation, wherein the second branch processor is implemented to obtain the second branch signal from the copied start signal according to the second processing regulation and using a complex right-hand rotary operation, wherein the third branch processor is implemented to obtain the third branch signal from the copied start signal according to a third processing regulation and using a negation, and wherein the fourth branch processor is implemented to obtain the fourth branch signal from the copied start signal according to a fourth processing regulation and using a complex left-hand rotary operation.

14. A method for converting a start signal into an end signal, comprising:

copying the start signal to obtain a plurality of copied start signals, wherein a copied start signal may be fed into a processing branch as a branch signal;

processing a first branch signal according to a first processing regulation in a first branch processor in the first processing branch to obtain a first processed branch signal;

processing a second branch signal according to a second processing regulation in a second branch processor in a second processing branch to obtain a second processed branch signal, wherein the second processing regulation is different from the first processing regulation, and wherein the first processing regulation and the second processing regulation are implemented to cause a low-pass polyphase filtering of the copied start signals; and wherein the step of processing the first or second processing signal includes performing an additional processing operation, an additional processing operation including a complex left-hand rotary operation or a complex right-hand rotary operation, wherein the branch signal is a complex signal having a real part and an imaginary part, the complex left-hand rotary operation or the complex right-hand rotary operation further including a real part/imaginary part exchange operation with a negation of the real part or the imaginary part;

copying the start signal to further determine a third and a fourth copied start signal from the start signal;

wherein each of the four copied start signals may be fed into one of four processing branches as a branch signal;

processing the third copied start signal according to a third processing regulation in a third branch processor in a third processing branch to obtain a third processed branch signal;

processing the fourth copied start signal according to a fourth processing regulation in a fourth branch processor in a fourth processing branch to obtain a fourth processed branch signal;

wherein the third and fourth processing regulation are selected to cause a low-pass polyphase filtering;

sequentially selecting the first processed branch signal and then the second processed branch signal and then the third processed branch signal and then the fourth processed branch signal in a selector to obtain the end signal, whereby the end signal has a four-fold sampling rate as compared to the start signal;

wherein the first branch signal is obtained from the copied start signal according to the first processing regulation, wherein the second branch signal is obtained from the copied start signal according to the second processing regulation and using a complex right-hand rotary operation, wherein the third branch signal is obtained from the copied start signal according to the third processing regulation and using a negation, and wherein the fourth branch signal is obtained from the copied start signal according to the fourth processing regulation and using a complex left-hand rotary operation.

15. A digital storage medium with program code stored thereupon for performing, when the computer program runs on a computer, a method for converting a start signal into an end signal, comprising:

copying the start signal to obtain a plurality of copied start signals, wherein a copied start signal may be fed into a processing branch as a branch signal;

processing a first branch signal according to a first processing regulation in the first branch processor in the first processing branch to obtain a first processed branch signal;

processing a second branch signal according to a second processing regulation in the second branch processor in a second processing branch to obtain a second processed branch signal, wherein the second processing regulation is different from the first processing regulation, and wherein the first processing regulation and the second processing regulation are implemented to cause a low-pass polyphase filtering of the copied start signals; and wherein the step of processing the first or second processing signal includes performing an additional processing operation, an additional processing operation including a complex left-hand rotary operation or a complex right-hand rotary operation, wherein the branch signal is a complex signal having a real part and an imaginary part, the complex left-hand rotary operation or the complex right-hand rotary operation further including a real part/imaginary part exchange operation with a negation of the real part or the imaginary part;

copying the start signal to further determine a third and a fourth copied start signal from the start signal;

wherein each of the four copied start signals may be fed into one of four processing branches as a branch signal;

processing the third copied start signal according to a third processing regulation in a third branch processor in a third processing branch to obtain a third processed branch signal;

processing the fourth copied start signal according to a fourth processing regulation in a fourth branch processor in a fourth processing branch to obtain a fourth processed branch signal;

wherein the third and fourth processing regulation are selected to cause a low-pass polyphase filtering;

sequentially selecting the first processed branch signal and then the second processed branch signal and then the third processed branch signal and then the fourth processed branch signal in a selector to obtain the end signal, whereby the end signal has a four-fold sampling rate as compared to the start signal;

wherein the first branch signal is obtained from the copied start signal according to the first processing regulation, wherein the second branch signal is obtained from the copied start signal according to the second processing regulation and using a complex left-hand rotary operation, wherein the third branch signal is obtained from the copied start signal according to the third processing regulation and using a negation, and wherein the fourth branch signal is obtained from the copied start signal according to the fourth processing regulation and using a complex right-hand rotary operation.

16. A digital storage medium with program code stored thereupon for performing, when the computer program runs on a computer, a method for converting a start signal into an end signal, comprising:

copying the start signal to obtain a plurality of copied start signals, wherein a copied start signal may be fed into a processing branch as a branch signal;

processing a first branch signal according to a first processing regulation in a first branch processor in the first processing branch to obtain a first processed branch signal;

processing a second branch signal according to a second processing regulation in a second branch processor in a second processing branch to obtain a second processed branch signal, wherein the second processing regulation is different from the first processing regulation, and wherein the first processing regulation and the second processing regulation are implemented to cause a low-pass polyphase filtering of the copied start signals; and wherein the step of processing the first or second processing signal includes performing an additional processing operation, an additional processing operation including a complex left-hand rotary operation or a complex right-hand rotary operation, wherein the branch signal is a complex signal having a real part and an imaginary part, the complex left-hand rotary operation or the complex right-hand rotary operation further including a real part/imaginary part exchange operation with a negation of the real part or the imaginary part;

copying the start signal to further determine a third and a fourth copied start signal from the start signal;

wherein each of the four copied start signals may be fed into one of four processing branches as a branch signal;

processing the third copied start signal according to a third processing regulation in a third branch processor in a third processing branch to obtain a third processed branch signal;

processing the fourth copied start signal according to a fourth processing regulation in a fourth branch processor in a fourth processing branch to obtain a fourth processed branch signal;

wherein the third and fourth processing regulation are selected to cause a low-pass polyphase filtering;

sequentially selecting the first processed branch signal and then the second processed branch signal and then the third processed branch signal and then the fourth processed branch signal in a selector to obtain the end signal, whereby the end signal has a four-fold sampling rate as compared to the start signal;

wherein the first branch signal is obtained from the copied start signal according to the first processing regulation, wherein the second branch signal is obtained from the copied start signal according to the second processing regulation and using a complex right-hand rotary operation, wherein the third branch signal is obtained from the copied start signal according to the third processing regulation and using a negation, and wherein the fourth branch signal is obtained from the copied start signal according to the fourth processing regulation and using a complex left-hand rotary operation.

* * * * *

UNITED STATES PATENT AND TRADEMARK OFFICE
CERTIFICATE OF CORRECTION

PATENT NO. : 7,529,534 B2
APPLICATION NO. : 11/300191
DATED : May 5, 2009
INVENTOR(S) : Marco Breiling It is certified that error appears in the above-identified patent and that said Letters Patent is hereby corrected as shown below:

Title Page:
CHANGE SECTION (75) INVENTOR:

FROM: "Stefan Koehler, Roedental (DE)"
TO: --Marco BREILING, Erlangen (DE)--

Signed and Sealed this

Eighth Day of September, 2009

David J. Kappos
*Director of the United States Patent and Trademark Office*